United States Patent
Na et al.

(10) Patent No.: US 9,692,405 B2
(45) Date of Patent: Jun. 27, 2017

(54) SWITCHING CIRCUIT

(71) Applicant: TOYOTA JIDOSHA KABUSHIKI KAISHA, Toyota-shi, Aichi-ken (JP)

(72) Inventors: Hyoungjun Na, Nagakute (JP); Ken Toshiyuki, Seto (JP); Shouji Abou, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/348,350

(22) Filed: Nov. 10, 2016

(65) Prior Publication Data
US 2017/0149426 A1 May 25, 2017

(30) Foreign Application Priority Data
Nov. 20, 2015 (JP) ................................ 2015-227860

(51) Int. Cl.
| | |
|---|---|
| *H03K 5/08* | (2006.01) |
| *H03K 17/06* | (2006.01) |
| *H03K 17/567* | (2006.01) |
| *H01L 27/06* | (2006.01) |
| *H01L 29/739* | (2006.01) |
| *H01L 29/861* | (2006.01) |
| *H01L 49/02* | (2006.01) |
| *H01L 23/528* | (2006.01) |
| *H01L 29/73* | (2006.01) |

(52) U.S. Cl.
CPC ......... *H03K 17/06* (2013.01); *H01L 27/0635* (2013.01); *H03K 17/567* (2013.01); *H01L 23/528* (2013.01); *H01L 28/20* (2013.01); *H01L 29/73* (2013.01); *H01L 29/7393* (2013.01); *H01L 29/861* (2013.01)

(58) Field of Classification Search
USPC ......................................... 327/383
See application file for complete search history.

(56) References Cited

U.S. PATENT DOCUMENTS

| | | | |
|---|---|---|---|
| 2008/0007236 A1* | 1/2008 | Elbanhawy | H02M 3/157 323/283 |
| 2016/0218621 A1* | 7/2016 | Hayashi | G01K 7/01 |
| 2016/0233858 A1* | 8/2016 | Wasekura | H03K 17/166 |

FOREIGN PATENT DOCUMENTS

| | | |
|---|---|---|
| JP | 2004-112916 A | 4/2004 |
| JP | 2016-146717 A | 8/2016 |

* cited by examiner

*Primary Examiner* — Lincoln Donovan
*Assistant Examiner* — Patrick Chen
(74) *Attorney, Agent, or Firm* — Oliff PLC

(57) ABSTRACT

A switching circuit switches a first IGBT and a second IGBT. A control circuit is equipped with a first switching element that is configured to be able to control a gate current of the first IGBT, a second switching element that is configured to be able to control a gate current of the second IGBT, and a third switching element that is connected between an electrode of the first IGBT and an electrode of the second IGBT. The control circuit controls a turn on timing and turn off timing.

6 Claims, 11 Drawing Sheets

SWITCHING CIRCUIT

INCORPORATION BY REFERENCE

The disclosure of Japanese Patent Application No. 2015-227860 filed on Nov. 20, 2015 including the specification, drawings and abstract is incorporated herein by reference in its entirety.

BACKGROUND

1. Field of the Disclosure

The disclosure relates to a switching circuit.

2. Description of Related Art

A switching circuit that utilizes a plurality of IGBT's is disclosed in Japanese Patent Application Publication No. 2004-112916 (JP 2004-112916 A). The IGBT's can switch a large current.

SUMMARY

In a switching circuit that utilizes an IGBT, a turn-off loss that is caused in the IGBT presents a problem. Conventionally, it is known that the switching speed of the IGBT is increased by reducing the gate resistance, and that the turn-off loss decreases when the switching speed is increased (i.e., when the gate resistance is reduced). However, the inventors have confirmed that the aforementioned relationship between the switching speed and the turn-off loss is not established in the case where the current flowing through the IGBT is small. That is, the inventors have confirmed that it is difficult to reduce the turn-off loss of the IGBT at the time of the flow of a small current by reducing the gate resistance. Accordingly, the present specification provides a new art for reducing the turn-off loss of the IGBT at the time of the flow of a small current.

The inventors have confirmed that while there is such a relationship that the turn-off loss decreases as the size of the IGBT decreases in the case where the current flowing through the IGBT is small, the relationship between the size of the IGBT and the turn-off loss disappears when the current flowing through the IGBT becomes large. The disclosure reduces the turn-off loss of the IGBT with the aid of this phenomenon.

A first aspect of the disclosure is a switching circuit (16) comprising: a first IGBT; a second IGBT; a wiring in which a parallel circuit of the first IGBT and the second IGBT is inserted; and a control circuit configured to switch the first IGBT and the second IGBT by controlling gate currents of the first IGBT and the second IGBT, wherein the control circuit includes a first switching element including a first main electrode and a second main electrode, the first switching element controlling a current between the first main electrode and the second main electrode, the first main electrode connected to a reference potential, and the first switching element configured to control the gate current of the first IGBT in accordance with a potential of the second main electrode, a second switching element including a third main electrode and a fourth main electrode, the second switching element controlling a current between the third main electrode and the fourth main electrode, the third main electrode connected to the reference potential, and the second switching element configured to control the gate current of the second IGBT in accordance with a potential of the fourth main electrode, and a third switching element connected between the second main electrode and the fourth main electrode, and the control circuit is configured to turn on both the first IGBT and the second IGBT at a turn-on timing, and turn off both the first IGBT and the second IGBT at a turn-off timing, when a current flowing through the wiring is larger than a threshold, turn on a first target IGBT as one of the first IGBT and the second IGBT at the turn-on timing, turn off the first target IGBT at the turn-off timing, and turn off a second target IGBT as the other of the first IGBT and the second IGBT prior to the turn-off timing, when the current flowing through the wiring is smaller than the threshold, turn on the first switching element and the second switching element with the third switching element on, when the gate currents are caused to simultaneously flow through the first IGBT and the second IGBT, and turn on that one of the first switching element and the second switching element which controls the first target IGBT with the third switching element off, when the gate current is caused to flow through the first target IGBT and the gate current is not caused to flow through the second target IGBT.

Incidentally, the control circuit may be a circuit that turns on the first IGBT and the second IGBT, or a circuit that turns off the first IGBT and the second IGBT. In the case where the control circuit is a circuit that turns on the first IGBT and the second IGBT, the gate current controlled by the control circuit is a current that charges the gate of the first IGBT and the gate of the second IGBT. In the case where the control circuit is a circuit that turns off the first IGBT and the second IGBT, the gate current controlled by the control circuit is a current that discharges the gate of the first IGBT and the gate of the second IGBT.

Besides, the second main electrode of the first switching element may be electrically conductive to the gate of the first IGBT, or may be connected to the gate of the first IGBT via another element (e.g., a bipolar transistor or the like). That is, the second main electrode may be connected to the gate of the first IGBT in any mode as long as the gate current of the first IGBT can be controlled in accordance with the potential of the second main electrode. Besides, the fourth main electrode of the second switching element may be electrically conductive to the gate of the second IGBT, or may be connected to the gate of the second IGBT via another element (e.g., a bipolar transistor or the like). That is, the fourth main electrode may be connected to the gate of the second IGBT in any mode as long as the gate current of the second IGBT can be controlled in accordance with the potential of the fourth main electrode.

Besides, with a view to turning off the second target IGBT prior to the turn-off timing, there can be a mode in which the second target IGBT is not turned on during the second control procedure, and there can also be a mode in which the second target IGBT is turned off prior to the first target IGBT after both the second target IGBT and the first target IGBT are turned on. Besides, it is also possible to adopt a mode in which one of the first IGBT and the second IGBT is fixed as the second target IGBT and the other is fixed as the first target IGBT, or a mode in which a period when the first IGBT is the second target IGBT and a period when the second IGBT is the second target IGBT alternately emerge.

Besides, the control circuit can determine whether to execute the first control procedure or the second control procedure, based on the current flowing through the wiring at the time of the determination or at a time point before the time of the determination. Besides, this determination may be made depending on whether or not the current itself flowing through the wiring is larger than a threshold, or depending on whether or not a predetermined value calculated based on the current flowing through the wiring is larger than a threshold. For example, a predicted value of the current flowing through the wiring may be calculated from the current flowing through the wiring at a time point before the time of the determination, and the determination may be made depending on whether or not the predicted value is larger than a threshold.

In this switching circuit, the parallel circuit in which the first IGBT and the second IGBT are connected in parallel to each other switches the current flowing through the wiring. Besides, this switching circuit executes the first control procedure and the second control procedure based on the current flowing through the wiring.

When the current flowing through the wiring is large, the first control procedure is executed. In the first control procedure, the first IGBT and the second IGBT are on from the turn-on timing to the turn-off timing. Therefore, a current flows through both the first IGBT and the second IGBT. In the case where the current flowing through the wiring is large, a current can be caused to flow through the first IGBT and the second IGBT in a scattered manner by executing the first control procedure. Thus, the loads applied to the first IGBT and the second IGBT can be reduced. Besides, the first IGBT and the second IGBT turn off at the turn-off timing. In this case, the size of the IGBT's that turn off is the sum of the size of the first IGBT and the size of the second IGBT. Therefore, the size of the IGBT's that turn off is large. However, in the first control procedure, the current flowing through the wiring (i.e., the first IGBT and the second IGBT) is large, so there is hardly any correlation between the size of the IGBT's that turn off and the turn-off loss. Accordingly, even when the first IGBT and the second IGBT are thus turned off, the turn-off loss that is caused is not so large.

When the current flowing through the wiring is small, the second control procedure is executed. In the second control procedure, the second target IGBT turns off prior to the turn-off timing. Accordingly, at the turn-off timing, the first target IGBT turns off with the second target IGBT already off. In this case, the size of the IGBT that turns off is the size of the first target IGBT. Therefore, the size of the IGBT that turns off is smaller than in the first control procedure. In the second control procedure, the current flowing through the wiring is small, so the turn-off loss can be reduced by turning off the first target IGBT with the second target IGBT off (i.e., reducing the size of the IGBT that turns off). Besides, in the second control procedure, the second target IGBT is off and the first target IGBT is on at least immediately before the turn-off timing. Therefore, a current flows through the first target IGBT without flowing through the second target IGBT. However, the current flowing through the wiring is small. Therefore, even when a current thus flows through the first target IGBT in a biased manner, no excessive load is applied to the first target IGBT.

As described hitherto, according to this switching circuit, the turn-off loss at the time of the flow of a small current can be reduced while reducing the loads applied to the respective IGBT's at the time of the flow of a large current.

Besides, in the first control procedure, gate currents are caused to flow through the first IGBT and the second IGBT, and the first IGBT and the second IGBT are switched (on or off). When the timing for switching the first IGBT and the timing for switching the second IGBT deviate from each other at this time, a large current flows through one of the IGBT's in a biased manner, so a high load is applied to the IGBT. The gate current of the first IGBT is controlled in accordance with the potential of the second main electrode of the first switching element, and the gate current of the second IGBT is controlled in accordance with the potential of the fourth main electrode of the second switching element. Therefore, when there arises a difference between the potential of the second main electrode and the potential of the fourth main electrode, there arises a difference between the gate current of the first IGBT and the gate current of the second IGBT, and the timing when the first IGBT switches and the timing when the second IGBT switches deviate from each other. In contrast, according to the switching circuit disclosed in the present specification, when gate currents are caused to flow through the first IGBT and the second IGBT, the first switching element and the second switching element are turned on with the third switching element on. When the third switching element is on, the second main electrode and the fourth main electrode are connected to each other and reach substantially the same potential. Therefore, a difference between the gate current of the first IGBT and the gate current of the second IGBT is unlikely to arise, and the timing when the first IGBT switches and the timing when the second IGBT switches are unlikely to deviate from each other. Accordingly, in this switching circuit, a large current can be restrained from flowing through one of the first IGBT and the second IGBT in a biased manner.

Besides, in the case where the current flowing through the wiring is smaller than a threshold, the second control procedure is executed. In the second control procedure, there is a case where a gate current is caused to flow through the first target IGBT without causing a gate current to flow through the second target IGBT (i.e., a case where the first target IGBT is switched without switching the second target IGBT). In this case, the switching element that controls the first target IGBT is turned on with the third switching element off. Incidentally, at this time, the switching element that controls the second target IGBT may be off or on. According to this configuration, the third switching element is off, so the potential of the second main electrode and the potential of the fourth main electrode are independent of each other. Accordingly, the first target IGBT can be switched alone by turning on the switching element that controls the first target IGBT.

A second aspect of the disclosure is a switching circuit including: a first IGBT; a second IGBT; a wiring in which a parallel circuit of the first IGBT and the second IGBT is inserted; and a control circuit including a first gate voltage control circuit that connects to a gate electrode of the first IGBT and that is configured to control a gate voltage of the first IGBT, a second gate voltage control circuit that connects to a gate electrode of the second IGBT and that is configured to control a gate voltage of the second IGBT, and a short-circuit control circuit that is configured to connect or disconnect between the gate electrode of the first IGBT and the gate electrode of the second IGBT, wherein the control circuit is configured to turn on both the first IGBT and the second IGBT at a turn-on timing, and turn off both the first IGBT and the second IGBT at a turn-off timing, when a current flowing through the wiring is larger than a threshold, and turn on the first IGBT without turning on the second IGBT at the turn-on timing, and turn off the first IGBT at the turn-off timing, when the current flowing through the wiring is smaller than the threshold, the short-circuit control circuit ensures connection between the first gate voltage control circuit and the second gate voltage control circuit when both the first IGBT and the second IGBT are turned on, and the short-circuit control circuit ensures disconnection between the first gate voltage control circuit and the second gate voltage control circuit when the first IGBT is turned on without turning on the second IGBT.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
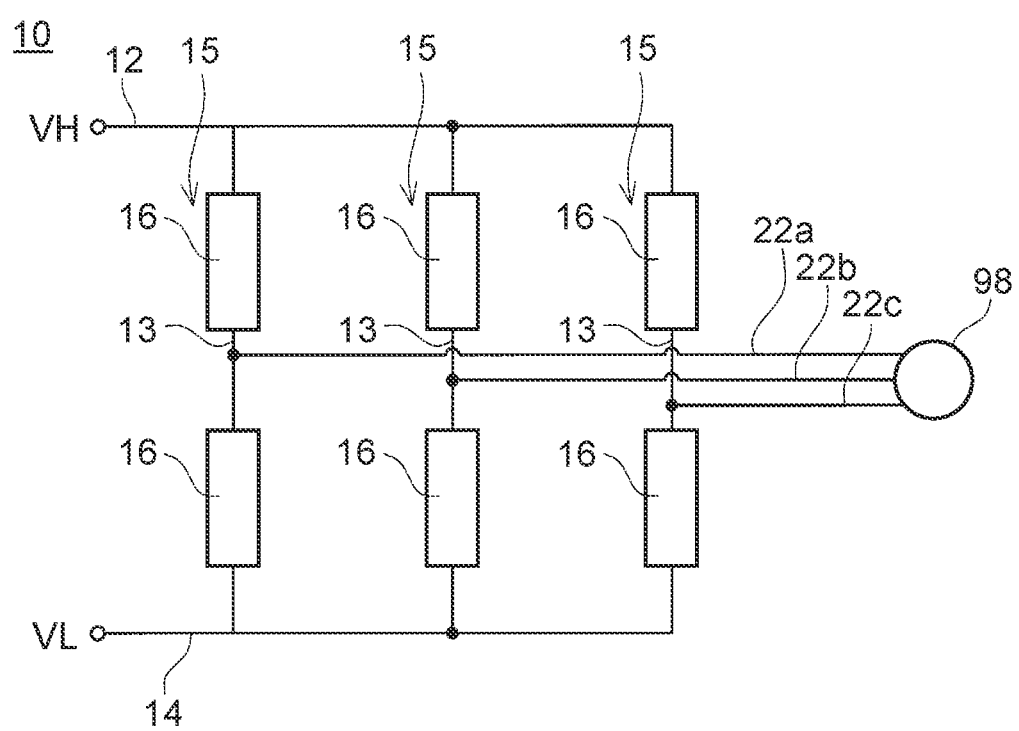
FIG. 1 is a circuit diagram of an inverter circuit 10.

The inverter circuit 10 in the first embodiment of the disclosure shown in FIG. 1 supplies an alternating current to a running motor 98 of a vehicle. The inverter circuit 10 has a high-potential wiring 12 and a low-potential wiring 14. The high-potential wiring 12 and the low-potential wiring 14 are connected to a direct-current electric power supply (not shown). A high potential VH is applied to the high-potential wiring 12, and a low potential VL is applied to the low-potential wiring 14. Three series circuits 15 are connected in parallel between the high-potential wiring 12 and the low-potential wiring 14. Each of the series circuits 15 has a connection wiring 13 that is connected between the high-potential wiring 12 and the low-potential wiring 14, and has two of the switching circuits 16 that are interposed in the connection wiring 13. The two switching circuits 16 are connected in series between the high-potential wiring 12 and the low-potential wiring 14. Output wirings 22a to 22c are connected to the connection wiring 13 between the two switching circuits 16 that are connected in series to each other. The other ends of the output wirings 22a to 22c are connected to the motor 98. The inverter circuit 10 supplies a three-phase alternating current to the motor 98 by switching the respective switching circuits 16.

Figure 2:
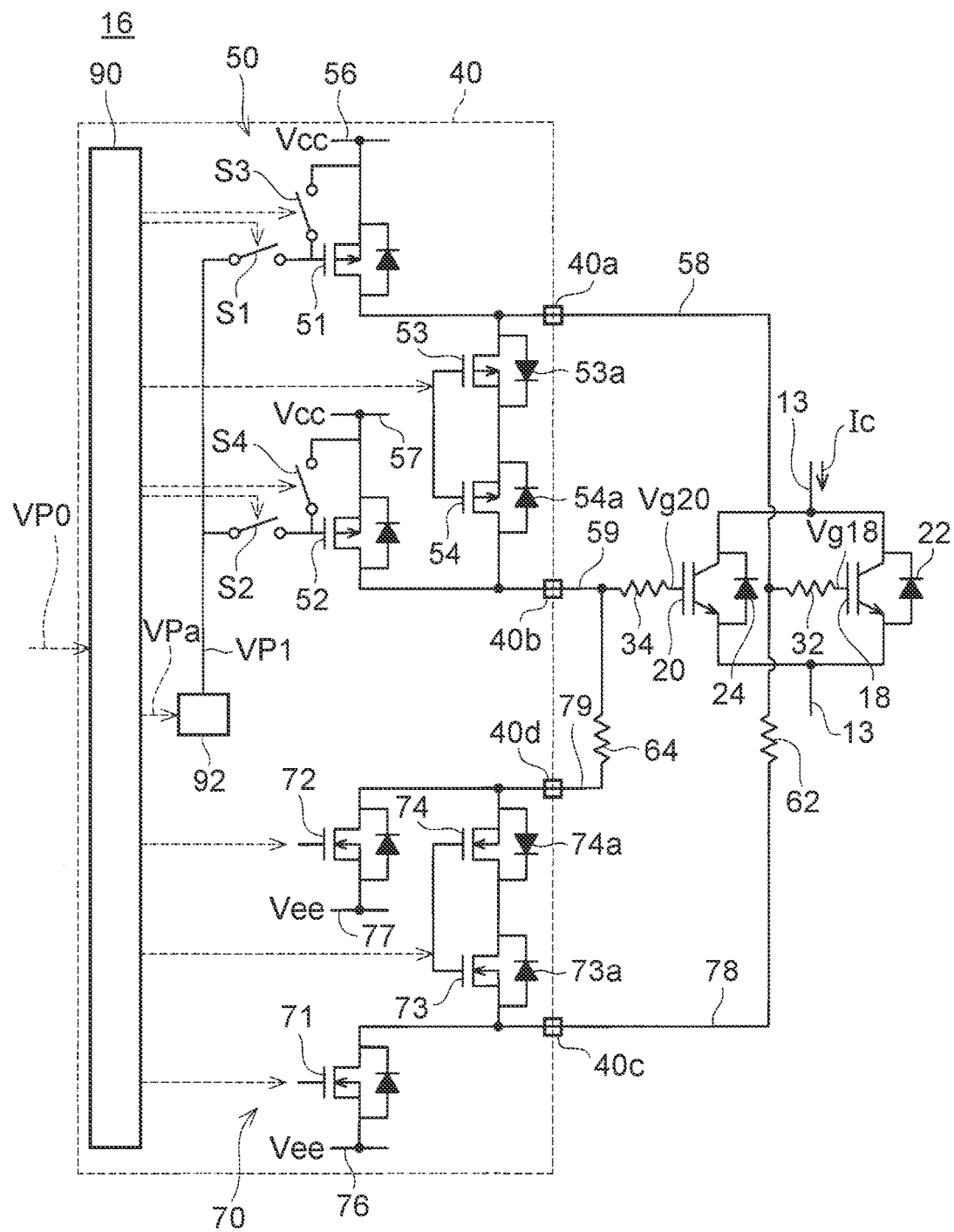
FIG. 2 is a circuit diagram of each of switching circuits 16 according to the first embodiment of the disclosure.

FIG. 2 shows an internal circuit of one of the switching circuits 16. Incidentally, the respective switching circuits 16 are identical in configuration to one another. As shown in FIG. 2, the switching circuit 16 has an IGBT 18 and an IGBT 20. The IGBT 18 and the IGBT 20 are connected in parallel to each other. That is, a collector of the IGBT 18 is connected to a collector of the IGBT 20, and an emitter of the IGBT 18 is connected to an emitter of the IGBT 20. A parallel circuit of the IGBT 18 and the IGBT 20 is interposed in the connection wiring 13. Besides, a diode 22 is connected in an antiparallel manner to the IGBT 18. That is, an anode of the diode 22 is connected to the emitter of the IGBT 18. A cathode of the diode 22 is connected to the collector of the IGBT 18. Besides, a diode 24 is connected in an antiparallel manner to the IGBT 20. An anode of the diode 24 is connected to the emitter of the IGBT 20. A cathode of the diode 24 is connected to the collector of the IGBT 20.

Figure 3:
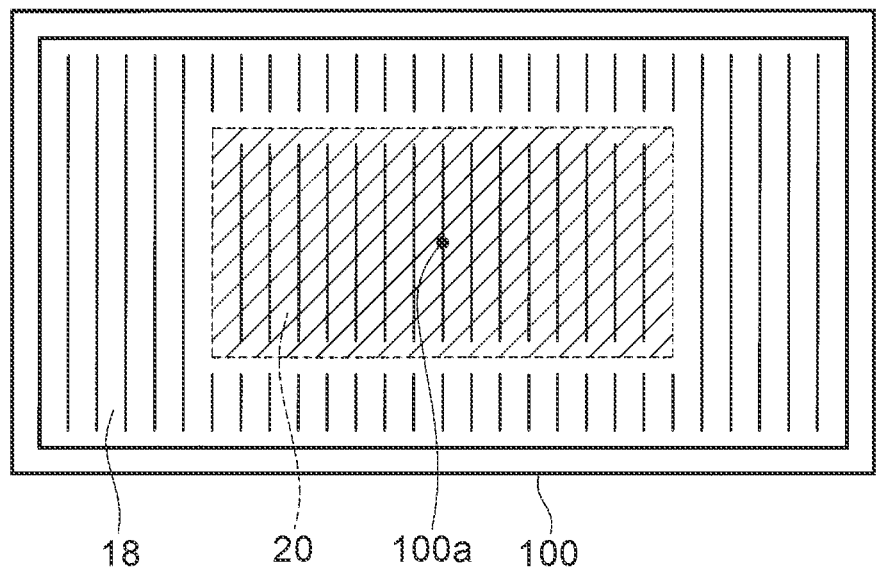
FIG. 3 is a plan view of a semiconductor substrate 100 that is equipped with IGBT's 18 and 20.

The IGBT 18 and the IGBT 20 may be formed on either separate semiconductor substrates or the same semiconductor substrate. In the case where the IGBT 18 and the IGBT 20 are formed on the same semiconductor substrate, a configuration shown in FIG. 3 can be adopted. In FIG. 3, when an upper face of the semiconductor substrate 100 is viewed in a plan view, the IGBT 20 is formed in a range including a center 100a of the semiconductor substrate 100, and the IGBT 18 is formed around the IGBT 20. The emitter of the IGBT 18 and the emitter of the IGBT 20 are connected to a common emitter electrode. The collector of the IGBT 18 and the collector of the IGBT 20 are connected to a common collector electrode. A gate electrode of the IGBT 18 and a gate electrode of the IGBT 20 are separated from each other. Accordingly, the gate potential of the IGBT 18 can be controlled to a potential that is different from the gate potential of the IGBT 20. That is, the gate potential of the IGBT 18 and the gate potential of the IGBT 20 can be individually controlled. Incidentally, FIG. 3 shows an example. In the case where the IGBT 18 and the IGBT 20 are formed on the same semiconductor substrate, a configuration different from that of FIG. 3 may be adopted.

The switching circuit 16 has gate resistors 32, 34, 62 and 64 and a gate control IC 40. The gate resistor 32 is connected at one end thereof to a gate of the IGBT 18, and is connected at the other end thereof to a terminal 40a of the gate control IC 40. The gate resistor 34 is connected at one end thereof to a gate of the IGBT 20, and is connected at the other end thereof to a terminal 40b of the gate control IC 40. The gate resistor 62 is connected at one end thereof to the gate of the IGBT 18 via the gate resistor 32, and is connected at the other end thereof to a terminal 40c of the gate control IC 40. The gate resistor 64 is connected at one end thereof to the gate of the IGBT 20 via the gate resistor 34, and is connected at the other end thereof to a terminal 40d of the gate control IC 40.

The gate control IC 40 controls a gate potential Vg18 of the IGBT 18 and a gate potential Vg20 of the IGBT 20. The gate control IC40 has a logic circuit 90, a control amplifier 92, a gate-on circuit 50 and a gate-off circuit 70.

Figure 4:
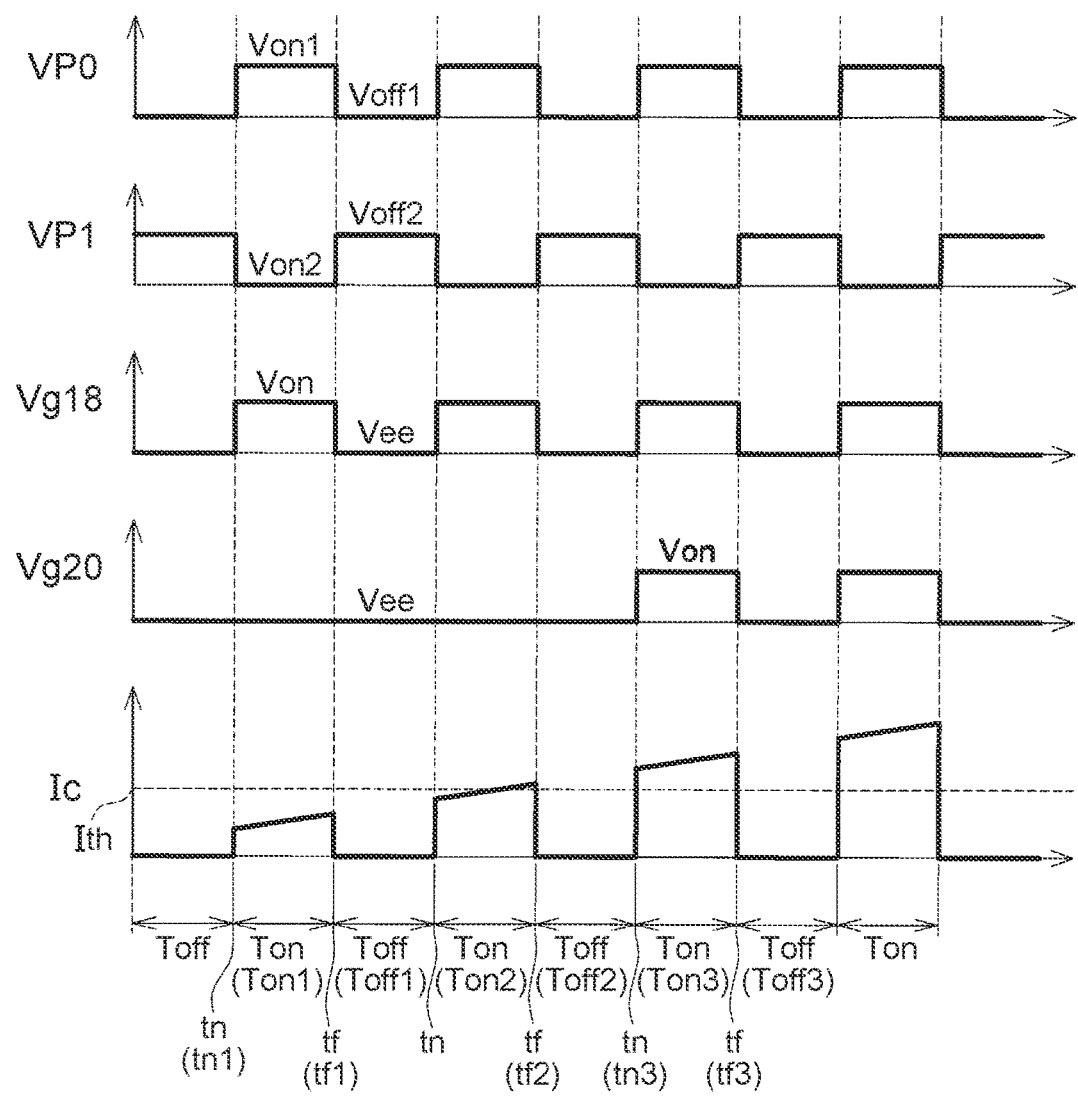
FIG. 4 is a graph showing changes in respective values with the passage of time in a unilateral control procedure and a bilateral control procedure in the first embodiment of the disclosure.

A PWM signal VP0 is input to the logic circuit 90 from the outside. As shown in FIG. 4, the PWM signal VP0 is a pulse signal that makes a transition between a high potential Von1 and a low potential Voff1. The duty ratio of the PWM signal VP0 changes in accordance with the operating state of the motor 98. A signal VPa that is identical in waveform to the PWM signal VP0 is transmitted from the logic circuit 90 to the control amplifier 92.

Besides, the value of a current Ic flowing through the connection wiring 13 is input to the logic circuit 90. A collector current of the IGBT 18 can be measured from a potential of a detection electrode (not shown) (an electrode for detecting the collector current) of the IGBT 18. Besides, a collector current of the IGBT 20 can be measured from a potential of a detection electrode (not shown) of the IGBT 20. By summating the collector current of the IGBT 18 and the collector current of the IGBT 20, the current Ic flowing through the connection wiring 13 is measured. Incidentally, the current Ic may be measured according to another method. The logic circuit 90 transmits a signal to the gate-on circuit 50 and the gate-off circuit 70 in accordance with the current Ic flowing through the connection wiring 13.

The signal VPa that is identical in waveform to the PWM signal VP0 is input to the control amplifier 92 from the logic circuit 90. Besides, although not shown in the drawing, the switching circuit 16 is equipped with a circuit that measures a gate potential and gate current of the IGBT 18, and a circuit that measures a gate potential and gate current of the IGBT 20. The values of the gate potential and gate current of the IGBT 18, and the values of the gate potential and gate current of the IGBT 20 are input to the control amplifier 92. The control amplifier 92 outputs a drive signal VP1 based on the signal VPa, the gate potential and the gate current. As shown in FIG. 4, the drive signal VP1 is a pulse signal that makes a transition between a low potential Von2 and a high potential Voff2. The drive signal VP1 is a pulse signal that is obtained by inverting the PWM signal VP0 (i.e., the signal VPa). Besides, the control amplifier 92 controls the magnitude of the low potential Von2 of the drive signal VP1 based on the gate potentials and gate currents of the IGBT's 18 and 20.

The gate-on circuit 50 has PMOS's 51 to 54 and switches S1 to S4.

A source of the PMOS 51 is connected to a wiring 56 to which a reference potential Vcc is applied. The reference potential Vcc is a potential that is higher than gate thresholds of the IGBT's 18 and 20. A drain of the PMOS 51 is connected to the terminal 40a. That is, the drain of the PMOS 51 is connected to the gate of the IGBT 18 via the gate resistor 32. A wiring that connects the drain of the PMOS 51 and the gate of the IGBT 18 to each other will be referred to hereinafter as a gate-on wiring 58. A gate of the PMOS 51 is connected to the control amplifier 92 via a switch S1. With the switch S1 on, the drive signal VP1 output by the control amplifier 92 is input to the gate of the PMOS 51. A switch S3 is connected between the gate and source of the PMOS 51. When the switch S3 is on, the PMOS 51 is held off.

A source of the PMOS 52 is connected to a wiring 57 to which the reference potential Vcc is applied. A drain of the PMOS 52 is connected to the terminal 40b. That is, the drain of the PMOS 52 is connected to the gate of the IGBT 20 via the gate resistor 34. A wiring that connects the drain of the PMOS 52 and the gate of the IGBT 20 to each other will be referred to hereinafter as a gate-on wiring 59. A gate of the PMOS 52 is connected to the control amplifier 92 via a switch S2. With the switch S2 on, the drive signal VP1 output by the control amplifier 92 is input to the gate of the PMOS 52. A switch S4 is connected between the gate and source of the PMOS 52. When the switch S4 is on, the PMOS 52 is held off.

The switches S1 to S4 are controlled by the logic circuit 90.

The PMOS 53 and the PMOS 54 are connected in series between the drain of the PMOS 51 and the drain of the PMOS 52 (i.e., between the gate-on wiring 58 and the gate-on wiring 59). That is, a drain of the PMOS 53 is connected to the drain of the PMOS 51, a source of the PMOS 53 is connected to a source of the PMOS 54, and a drain of the PMOS 54 is connected to the drain of the PMOS 52. A body of the PMOS 53 is connected to the source (a source electrode) of the PMOS 53. Accordingly, a parasitic diode 53a of the PMOS 53 prevents a current from running from the source of the PMOS 53 toward the drain of the PMOS 53, and allows a current to pass from the drain of the PMOS 53 toward the source of the PMOS 53. A body of the PMOS 54 is connected to the source (a source electrode) of the PMOS 54. Accordingly, a parasitic diode 54a of the PMOS 54 prevents a current from running from the source of the PMOS 54 toward the drain of the PMOS 54, and allows a current to pass from the drain of the PMOS 54 toward the source of the PMOS 54. A gate of the PMOS 53 and a gate of the PMOS 54 are connected to each other. Gate potentials of the PMOS's 53 and 54 are controlled by the logic circuit 90.

The gate-off circuit 70 has NMOS's 71 to 74.

A source of the NMOS 71 is connected to a wiring 76 to which a reference potential Vee is applied. The reference potential Vee is a potential that is approximately equal to emitter potentials of the IGBT's 18 and 20. A drain of the NMOS 71 is connected to the terminal 40c. That is, the drain of the NMOS 71 is connected to the gate of the IGBT 18 via the gate resistors 62 and 32. A wiring that connects the drain of the NMOS 71 and the gate of the IGBT 18 to each other will be referred to hereinafter as a gate-off wiring 78. A gate of the NMOS 71 is connected to the logic circuit 90.

A source of the NMOS 72 is connected to a wiring 77 to which the reference potential Vee is applied. A drain of the NMOS 72 is connected to the terminal 40d. That is, the drain of the NMOS 72 is connected to the gate of the IGBT 20 via the gate resistors 64 and 34. A wiring that connects the drain of the NMOS 72 and the gate of the IGBT 20 to each other will be referred to hereinafter as a gate-off wiring 79. A gate of the NMOS 72 is connected to the logic circuit 90.

The NMOS 73 and the NMOS 74 are connected in series between the drain of the NMOS 71 and the drain of the NMOS 72 (i.e., between the gate-off wiring 78 and the gate-off wiring 79). That is, a source of the NMOS 73 is connected to the drain of the NMOS 71, a drain of the NMOS 73 is connected to a drain of the NMOS 74, and a source of the NMOS 74 is connected to the drain of the NMOS 72. A body of the NMOS 73 is connected to the source (a source electrode) of the NMOS 73. Accordingly, a parasitic diode 73a of the NMOS 73 prevents a current from running from the drain of the NMOS 73 toward the source of the NMOS 73, and allows a current to pass from the source of the NMOS 73 toward the drain of the NMOS 73. A body of the NMOS 74 is connected to the source (a source electrode) of the NMOS 74. Accordingly, a parasitic diode 74a of the NMOS 74 prevents a current from running from the drain of the NMOS 74 toward the source of the NMOS 74, and allows a current to pass from the source of the NMOS 74 toward the drain of the NMOS 74. A gate of the NMOS 73 and a gate of the NMOS 74 are connected to each other. The gates of the NMOS's 73 and 74 are connected to the logic circuit 90. Gate electrodes of the NMOS's 73 and 74 are controlled by the logic circuit 90.

Next, the operation of the switching circuit 16 will be described. As shown in FIG. 4, the PWM signal VP0 input to the logic circuit 90 makes a transition between the high potential Von1 and the low potential Voff1. The high potential Von1 is a signal meaning to turn on the switching circuit 16, and the low potential Voff1 is a signal meaning to turn off the switching circuit 16. Accordingly, a timing when the PWM signal VP0 makes a transition from the low potential Voff1 to the high potential Von1 is a turn-on timing to for turning on the switching circuit 16. Besides, a timing when the PWM signal VP0 makes a transition from the high potential Von1 to the low potential Voff1 is a turn-off timing tf for turning off the switching circuit 16. Besides, a period when the PWM signal VP0 is at the high potential Von1 will be referred to hereinafter as an on period Ton, and a period when the PWM signal VP0 is at the low potential Voff1 will be referred to hereinafter as an off period Toff.

The logic circuit 90 executes a unilateral control procedure for switching only the IGBT 18, and a bilateral control procedure for switching both the IGBT 18 and the IGBT 20, in accordance with the current Ic. In a period before a turn-off timing tf2 in FIG. 4, the current Ic is small, so the logic circuit 90 executes the unilateral control procedure. In a period after the turn-off timing tf2, the current Ic is large, so the logic circuit 90 executes the bilateral control procedure. The details of the unilateral control procedure and the bilateral control procedure will be described hereinafter.

In the unilateral control procedure, the logic circuit 90 controls respective components as follows.
the switch S1: on
the switch S2: off
the switch S3: off
the switch S4: on
the PMOS's 53 and 54: off
the NMOS's 73 and 74: off
the NMOS 72: on The switch S2 is off, and the switch S4 is on, so the PMOS 52 is held off during the unilateral control procedure. Besides, the NMOS's 73 and 74 are off, and the NMOS 72 is on, so the potential Vee (a potential that is lower than the gate threshold) is applied to the gate of the IGBT 20 during the unilateral control procedure. Accordingly, the IGBT 20 is held off. Besides, the switch S1 is on, so the drive signal VP1 of the control amplifier is input to the gate of the PMOS 51 during the unilateral control procedure. Besides, the switch S3 is off, so the PMOS 51 switches in accordance with the drive signal VP1 during the unilateral control procedure. Besides, the logic circuit 90 applies a signal VP2 obtained by inverting the PWM signal VP0 to the gate of the NMOS 71.

When the respective components are controlled as described above, the PMOS 51 turns on and the NMOS 71 turns off at a first turn-on timing tn1 in FIG. 4. Then, a gate current flows from the wiring 56 toward the gate of the IGBT 18 via the PMOS 51 and the gate-on wiring 58. Therefore, the gate of the IGBT 18 is charged, and the gate potential Vg18 rises from the potential Vee to a potential Von. Incidentally, the potential Von is a potential that is lower than the potential Vcc and higher than the gate threshold of the IGBT 18. The gate potential of the PMOS 51 is controlled through feedback control, and the gate potential of the IGBT 18 is thereby accurately controlled to the potential Von. The potential Von is higher than the gate threshold of the IGBT 18, so the IGBT 18 turns on. Accordingly, the current Ic flows during the on period Ton1. The current Ic gradually increases during the on period Ton1.

Incidentally, in the on period Ton1, the potential of the gate-on wiring 58 (i.e., the potential Von) is higher than the potential of the gate-on wiring 59 (i.e., the potential Vee). However, the PMOS's 53 and 54 are off, and the parasitic diode 54a of the PMOS 54 prevents a current from running from the gate-on wiring 58 toward the gate-on wiring 59, so no current flows from the gate-on wiring 58 toward the gate-on wiring 59.

Besides, in the on period Ton1, the potential of the gate-off wiring 78 (i.e., the potential Von) is higher than the potential of the gate-off wiring 79 (i.e., the potential Vee). However, the NMOS's 73 and 74 are off, and the parasitic diode 74a of the NMOS 74 prevents a current from running from the gate-off wiring 78 toward the gate-off wiring 79, so no current flows from the gate-off wiring 78 toward the gate-off wiring 79.

After that, with the advent of a turn-off timing tf1, the PMOS 51 turns off, and the NMOS 71 turns on. Then, a gate current flows from the gate of the IGBT 18 toward the wiring 76 via the gate-off wiring 78 and the NMOS 71. Therefore, the gate of the IGBT 18 is discharged, and the gate potential Vg18 falls from the potential Von to the potential Vee. The potential Vee is lower than the gate threshold of the IGBT 18, so the IGBT 18 turns off. Accordingly, the current Ic does not flow during an off period Toff1.

In the unilateral control procedure, the IGBT 18 repeats turning on and off through the repetition of the on period Ton and the off period Toff. That is, in the unilateral control procedure, the IGBT 18 repeats turning on and off with the IGBT 20 held off.

The logic circuit 90 constantly monitors the current Ic. When the current Ic exceeds a threshold Ith during a period Ton2 when the unilateral control procedure is executed, the logic circuit 90 changes over the procedure from the unilateral control procedure to the bilateral control procedure during the immediately following off period Toff. Incidentally, it is also possible to impart hysteresis characteristics to the threshold Ith.

In the bilateral control procedure, the logic circuit 90 controls the respective components as follows.
the switch S1: on
the switch S2: on
the switch S3: off
the switch S4: off
the PMOS's 53 and 54: on
the NMOS's 73 and 74: on The switches S1 and S2 are on, so the drive signal VP1 of the control amplifier 92 is input to the gate of the PMOS 51 and the gate of the PMOS 52 during the bilateral control procedure. Besides, the switches S3 and S4 are off, so the PMOS's 51 and 52 switch in accordance with the drive signal VP1 during the bilateral control procedure. Besides, the PMOS's 53 and 54 are on, so the gate-on wiring 58 and the gate-on wiring 59 are short-circuited during the bilateral control procedure. Besides, the NMOS's 73 and 74 are on, so the gate-off wiring 78 and the gate-off wiring 79 are short-circuited during the bilateral control procedure. Besides, the logic circuit 90 applies the signal VP2 obtained by inverting the PWM signal VP0 to the gate of the NMOS 71 and the gate of the NMOS 72.

Even when the respective components are controlled as described above, the current Ic does not flow during an off period Toff2. That is, during the off period Toff2, the PMOS's 51 and 52 are off, and the NMOS's 71 and 72 are on, so both the gate potential Vg18 of the IGBT 18 and the gate potential Vg20 of the IGBT 20 are held equal to the potential Vee. Accordingly, during the off period Toff, both the IGBT's 18 and 20 are held off, and the current Ic does not flow.

When the drive signal VP1 is lowered from Voff2 to Von2 at a turn-on timing tn3 immediately following the off period Toff2, both the PMOS's 51 and 52 turn on. Besides, at the turn-on timing tn3, the gate potentials of the NMOS's 71 and 72 are lowered, so the NMOS's 71 and 72 turn off. When the PMOS 51 turns on and the NMOS 71 turns off, a gate current flows from the wiring 56 toward the gate of the IGBT 18 via the PMOS 51 and the gate-on wiring 58. Therefore, the gate of the IGBT 18 is charged, and the gate potential Vg18 rises from the potential Vee to the potential Von. That is, the IGBT 18 turns on. Besides, when the PMOS 52 turns on and the NMOS 72 turns off, a gate current flows from the wiring 57 toward the gate of the IGBT 20 via the PMOS 52 and the gate-on wiring 59. Therefore, the gate of the IGBT 20 is charged, and the gate potential Vg20 rises from the potential Vee to the potential Von. That is, the IGBT 20 turns on. As described hitherto, in an on period Ton3 of the bilateral control procedure, both the IGBT's 18 and 20 turn on. Accordingly, the current Ic flows during the on period Ton3.

After that, with the advent of a turn-off timing tf3, the PMOS's 51 and 52 turn off, and the NMOS's 71 and 72 turn on. When the PMOS 51 turns off and the NMOS 71 turns on, a gate current flows from the gate of the IGBT 18 toward the wiring 76 via the gate-off wiring 78 and the NMOS 71. Therefore, the gate of the IGBT 18 is discharged, and the gate potential Vg18 falls from the potential Von to the potential Vee. That is, the IGBT 18 turns off. Besides, when the PMOS 52 turns off and the NMOS 72 turns on, a gate current flows from the gate of the IGBT 20 toward the wiring 77 via the gate-off wiring 79 and the NMOS 72. Therefore, the gate of the IGBT 20 is discharged, and the gate potential Vg20 falls from the potential Von to the potential Vee. That is, the IGBT 20 turns off. As described hitherto, in an off period Toff3, both the IGBT's 18 and 20 are off. Accordingly, the current Ic does not flow during the off period Toff3.

In the bilateral control procedure, the IGBT 18 and the IGBT 20 substantially simultaneously repeat turning on and off through the repetition of the on period Ton and the off period Toff.

An effect of suppressing a turn-off loss of the switching circuit 16 will be described hereinafter. When the IGBT's 18 and 20 turn off, a turn-off loss is caused. In the case where the current Ic is small, there emerges a correlation between the turn-off loss and the size of the IGBT that turns off. That is, the turn-off loss decreases as the size of the IGBT that turns off decreases. In the case where the current Ic is large, such a correlation hardly emerges. The reason why the aforementioned correlation thus changes in accordance with the current Ic is considered to be as follows. The turn-off loss is caused through the discharge of carriers (electrons and holes) present in the semiconductor substrate of the IGBT immediately before a turn-off from the semiconductor substrate at the time of the turn-off. The number of electrons present in the semiconductor substrate during the flow of the current Ic increases as the current Ic increases. On the other hand, the interior of the semiconductor substrate is saturated with holes as long as the current Ic flows, regardless of whether the current Ic is large or small. That is, the number of holes present in the semiconductor substrate at the time of the flow of the current Ic is substantially constant regardless of the current Ic. Accordingly, in the case where the current Ic is small, the turn-off loss is caused mainly due to the influence of holes. As described above, a region of the semiconductor substrate through which the current Ic flows is saturated with holes, so the number of holes at this time is substantially proportional to the size of the IGBT (i.e., the area of the region of the semiconductor substrate through which the current Ic flows). Accordingly, in the case where the current Ic is small, there emerges a correlation between the turn-off loss and the size of the IGBT that turns off. On the other hand, in the case where the current Ic is large, the number of electrons present in the semiconductor substrate is large, so the turn-off loss is caused mainly due to the influence of electrons. Therefore, in the case where the current Ic is large, there is hardly no correlation between the turn-off loss and the size of the IGBT that turns off.

As described above, in the case where the current Ic is small, the switching circuit 16 turns on only the IGBT 18 without turning on the IGBT 20 in the on period Ton. That is, the switching circuit 16 turns off the IGBT 20 prior to the turn-off timing tf, and turns off the IGBT 18 at the turn-off timing tf. Accordingly, the IGBT 18 turns off alone at the turn-off timing tf (e.g., at the turn-off timing tf1 in FIG. 4). In the case where the IGBT 18 turns off alone, the size of the region of the semiconductor substrate 100 that turns off (i.e., the area of the region of the IGBT 18 in FIG. 3) is small, so the turn-off loss is small. Besides, in the case where the current Ic is small, even when the current Ic flows through only the IGBT 18 in the on period Ton, the load applied to the IGBT 18 is not so high. As described hitherto, in the case where the current Ic is small, the IGBT 18 turns off alone at the turn-off timing tf. Thus, the turn-off loss can be reduced while preventing an excessive load from being applied to the IGBT 18.

Besides, as described above, in the case where the current Ic is large, the switching circuit 16 turns on both the IGBT 18 and the IGBT 20 in the on period Ton. That is, the switching circuit 16 turns on both the IGBT 18 and the IGBT 20 at the turn-on timing tn, and turns off both the IGBT 18 and the IGBT 20 at the turn-off timing. Accordingly, the current Ic flowing through the connection wiring 13 flows through the IGBT 18 and the IGBT 20 in a scattered manner. As described hitherto, in the case where the current Ic is large, the current Ic is caused to flow through the IGBT 18 and the IGBT 20 in a scattered manner. Thus, a high load can be prevented from being applied to the IGBT 18 and the IGBT 20. Besides, at the turn-off timing tf (e.g., at the turn-off timing tf3 in FIG. 4), both the IGBT 18 and the IGBT 20 turn off. In this case, the size of the region of the semiconductor substrate 100 that turns off is equal to a total of the area of the IGBT 18 in FIG. 3 and the area of the IGBT 20 in FIG. 3. That is, in this case, the size of the region that turns off is large. However, in the case where the current Ic is large, there is hardly no correlation between the size of the IGBT that turns off and the turn-off loss. Accordingly, even when the IGBT 18 and the IGBT 20 are simultaneously turned off, the turn-off loss does not become larger than in the case where only one of the IGBT's is turned off. As described hitherto, in the case where the current Ic is large, both the IGBT's 18 and 20 are turned on in the on period Ton. Thus, the loads applied to the IGBT's 18 and 20 can be alleviated without increasing the turn-off loss.

Besides, as is apparent from the foregoing description, in this switching circuit 16, the energization time of the IGBT 18 (i.e., the time when the IGBT 18 is on) is longer than the energization time of the IGBT 20. Besides, as shown in FIG. 3, the IGBT 20 is formed at a central portion of the semiconductor substrate 100, and the IGBT 18 is formed therearound. The IGBT 18 that is formed on an outer peripheral side exhibits higher heat radiation performance than the IGBT 20 that is formed at the central portion. As described hitherto, the temperature of the semiconductor substrate 100 can be favorably restrained from rising, by lengthening the energization time of the IGBT 18 that exhibits high heat radiation performance.

Besides, in the switching circuit 16 according to the first embodiment of the disclosure, when both the IGBT's 18 and 20 are turned on in the bilateral control procedure, the PMOS's 51 and 52 are turned on with the PMOS's 53 and 54 already on. That is, the PMOS's 51 and 52 are turned on with the gate-on wiring 58 and the gate-on wiring 59 short-circuited. By short-circuiting the gate-on wirings 58 and 59 in this manner, the timing for turning on the IGBT 18 and the timing for turning on the IGBT 20 can be made to substantially coincide with each other, and the current density of the current Ic flowing through the IGBT 18 and the current density of the current Ic flowing through the IGBT 20 can be made approximately equal to each other during the on period Ton. Thus, the effect of scattering the loads applied to the IGBT's 18 and 20 can be obtained. The details will be described hereinafter.

First of all, a problem in the case where the gate-on wiring 58 and the gate-on wiring 59 are not short-circuited will be described. The PMOS 51 and the PMOS 52 have a dispersion of properties based on manufacturing errors and the like. For example, the gate threshold and the on resistance differ between the PMOS 51 and the PMOS 52 in some cases. In general, the errors in the gate threshold and on resistance of an MOS are large. In the case where there is a difference in gate threshold, even when an attempt is made to simultaneously turn on the PMOS's 51 and 52, there arises a deviation between the timings for turning on these PMOS's. Accordingly, there arises a difference between the timing when a gate current starts flowing through the IGBT 18 and the timing when a gate current starts flowing through the IGBT 20. Besides, when there is a difference between the on resistance of the PMOS 51 and the on resistance of the PMOS 52, there arises a difference between the magnitude of the current of the PMOS 51 and the magnitude of the current of the PMOS 52. That is, there arises a difference between the magnitude of the gate current of the IGBT 18 and the magnitude of the gate current of the IGBT 20. As described hitherto, when there is a difference between the timing when the gate current starts flowing through the IGBT 18 and the timing when the gate current starts flowing through the IGBT 20 or a difference between the magnitude of the gate current of the IGBT 18 and the magnitude of the gate current of the IGBT 20, there arises a difference between the speed of charging the gate of the IGBT 18 and the speed of charging the gate of the IGBT 20. As a result, there arises a difference between the timing when the IGBT 18 turns on and the timing when the IGBT 20 turns on. When one of the IGBT's turns on prior to the other IGBT, a large current instantaneously flows through the IGBT that has first turned on, and a high load is applied to the IGBT that has first turned on. Besides, in the case where the gate potentials Vg18 and Vg20 are controlled in a feedback manner as in the first embodiment of the disclosure, there also arises a difference between the gate potentials Vg18 and Vg20 (i.e., Von in FIG. 4) that are controlled to a constant value during the on period Ton, based on the difference between the properties of the PMOS 51 and the properties of the PMOS 52. Therefore, there arises a difference between the current density of the current Ic flowing through the IGBT 18 during the on period Ton and the current density of the current Ic flowing through the IGBT 20 during the on period Ton. In this case as well, a high load is applied to one of the IGBT's.

In contrast, with the switching circuit 16 according to the first embodiment of the disclosure, the PMOS's 51 and 52 are turned on after the gate-on wiring 58 and the gate-on wiring 59 are short-circuited. In the case where the gate-on wiring 58 and the gate-on wiring 59 are short-circuited, even when there arises a difference between the timing when the PMOS 51 turns on and the timing when the PMOS 52 turns on or a difference between the current of the PMOS 51 and the current of the PMOS 52, currents flow through the gate-on wiring 58 and the gate-on wiring 59 in such a manner as to compensate for each other via the PMOS's 53 and 54. Therefore, there arises no difference between the timing when the IGBT 18 turns on and the timing when the IGBT 20 turns on. For example, in the case where the PMOS 51 turns on prior to the PMOS 52, part of the current flowing through the PMOS 51 charges the gate of the IGBT 18, and the rest of the gate current charges the gate of the IGBT 20 via the PMOS's 53 and 54. Besides, in the case where the current flowing through the PMOS 51 is larger than the current flowing through the PMOS 52, part of the current flowing through the PMOS 51 charges the gate of the IGBT 18, and the rest of the gate current charges the gate of the IGBT 20 via the PMOS's 53 and 54. As described hitherto, the currents flowing through the PMOS's 51 and 52 compensate for each other, so the gate potential Vg18 of the IGBT 18 and the gate potential Vg20 of the IGBT 20 can be increased substantially in the same manner. Accordingly, the IGBT's 18 and 20 can be substantially simultaneously turned on. Besides, the gate potentials Vg18 and Vg20 during the on period can be made approximately equal to each other, so a difference between the current density of the IGBT 18 and the current density of the IGBT 20 is unlikely to arise. In consequence, according to the configuration of the first embodiment of the disclosure, the load can be prevented from being biased toward one of the IGBT's, and the effect of scattering the load can be obtained.

Besides, in the case where the IGBT's 18 and 20 are simultaneously turned off in the bilateral control procedure as well, the effect of scattering the load can be obtained by turning on the NMOS's 73 and 74 to short-circuit the gate-off wiring 78 and the gate-off wiring 79. That is, if the gate-off wiring 78 and the gate-off wiring 79 are not short-circuited, there arises a difference between the timing when the IGBT 18 turns off and the timing when the IGBT 20 turns off due to a difference between the properties of the NMOS 71 and the properties of the NMOS 72, when the IGBT's 18 and 20 are turned off. When one of the IGBT's first turns off, a current flows in a biased manner through the other IGBT that has not turned off yet, and the load applied to this IGBT becomes high. In contrast, with the switching circuit 16 according to the first embodiment of the disclosure, the IGBT's 18 and 20 can be substantially simultaneously turned off by turning on the NMOS's 71 and 72 with the gate-off wiring 78 and the gate-off wiring 79 short-circuited. Accordingly, in the case where the IGBT's 18 and 20 are simultaneously turned off as well, the effect of scattering the load can be obtained.

A switching circuit according to the second embodiment of the disclosure has a configuration similar to that of the switching circuit according to the first embodiment of the disclosure shown in FIG. 2. In the case where the current Ic is large, the switching circuit according to the second embodiment of the disclosure executes the bilateral control procedure in the same manner as in the first embodiment of the disclosure. That is, in the case where the current Ic is large, both the IGBT 18 and the IGBT 20 are turned on in the on period Ton, and both the IGBT 18 and the IGBT 20 are turned off in the off period Toff. In the switching circuit according to the second embodiment of the disclosure, the control method is different from that of the first embodiment of the disclosure in the case where the current Ic is small.

Figure 5:
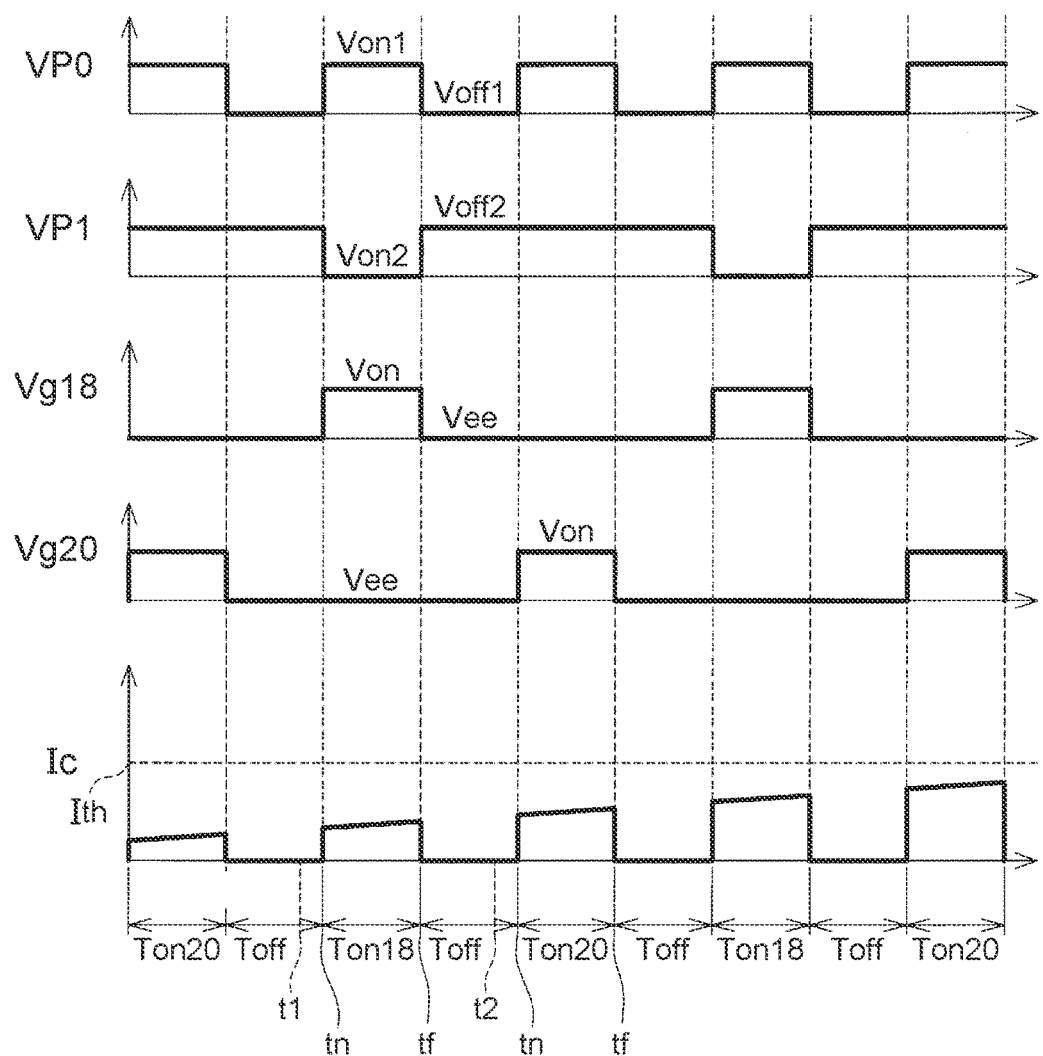
FIG. 5 is a graph showing changes in respective values with the passage of time in a unilateral control procedure in the second embodiment of the disclosure.

In the case where the current Ic is small, the switching circuit according to the second embodiment of the disclosure executes the unilateral control procedure as shown in FIG. 5. That is, in the case where the current Ic is small, the logic circuit 90 controls the IGBT's 18 and 20 such that an on period Ton18 when only the IGBT 18 turns on and an on period Ton20 when only the IGBT 20 turns on alternately emerge. More specifically, the logic circuit 90 performs control such that the on period Ton18, the off period Toff, the on period Ton20 and the off period Toff repeatedly emerge in this sequence. In the off period Toff, both the IGBT 18 and the IGBT 20 are off. For example, the logic circuit 90 determines at a timing t1 in FIG. 5 that the current Ic is smaller than the threshold Ith in the immediately preceding on period Ton20. Then, in the subsequent on period Ton18, the logic circuit 90 turns on the IGBT 18 and holds the IGBT 20 off. Since the current Ic has not risen to the threshold Ith in this on period Ton18, the logic circuit 90 determines at a timing t2 that the current Ic is smaller than the threshold Ith in the immediately preceding on period Ton18. Then, in the subsequent on period Ton20, the logic circuit 90 turns on the IGBT 20 and holds the IGBT 18 off. As described hitherto, the logic circuit 90 turns on that one of the IGBT's 18 and 20 which was not turned on in the last on period Ton in the subsequent on period Ton. Therefore, while the current Ic is small, the IGBT 18 and the IGBT 20 alternately turn on. The heat generated in the semiconductor substrate 100 can be scattered by alternately turning on the IGBT 18 and the IGBT 20 in this manner. Thus, the temperature of the semiconductor substrate 100 can be restrained from rising. Besides, with this configuration as well, in the case where the current Ic is small, the IGBT 18 or the IGBT 20 turns off alone at the turn-off timing tf, so the turn-off loss can be reduced.

Incidentally, in the unilateral control procedure of FIG. 5, processes of turning on and off the IGBT 18 alone are executed in the same manner as in the first embodiment of the disclosure. In the unilateral control procedure of FIG. 5, the process of turning on the IGBT 20 alone is executed by turning on the PMOS 52 with the PMOS's 51, 53 and 54 off. In the unilateral control procedure of FIG. 5, the process of turning off the IGBT 20 alone is executed by turning on the NMOS 72 with the NMOS 71 on and with the NMOS's 73 and 74 off.

Incidentally, as is apparent from FIG. 5, in the second embodiment of the disclosure, the gate potential Vg20 is higher than the gate potential Vg18 in the on period Ton20. That is, the potential of the gate-on wiring 59 is higher than the potential of the gate-on wiring 58. However, the PMOS's 53 and 54 are off, and the parasitic diode 53a of the PMOS 53 prevents a current from running from the gate-on wiring 59 toward the gate-on wiring 58, so no current flows from the gate-on wiring 59 toward the gate-on wiring 58. As described hitherto, the PMOS's 53 and 54 are connected such that the parasitic diodes 53a and 54a are connected in series to each other in opposite directions. Thus, in the case where the potential of the gate-on wiring 59 is high as well as the case where the potential of the gate-on wiring 58 is high, the leakage of current can be prevented.

Besides, when the gate potential Vg20 becomes higher than the gate potential Vg18 in the on period Ton20, the potential of the gate-off wiring 79 becomes higher than the potential of the gate-off wiring 78. However, the NMOS's 73 and 74 are off, and the parasitic diode 73a of the NMOS 73 prevents a current from running from the gate-off wiring 79 toward the gate-off wiring 78, so no current flows from the gate-off wiring 79 toward the gate-off wiring 78. As described hitherto, the NMOS's 73 and 74 are connected such that the parasitic diodes 73a and 74a are connected in series to each other in opposite directions. Thus, in the case where the potential of the gate-off wiring 79 is high as well as the case where the potential of the gate-off wiring 78 is high, the leakage of current can be prevented.

A switching circuit according to the third embodiment of the disclosure has a configuration similar to that of the switching circuit according to the first embodiment of the disclosure shown in FIG. 2. In the case where the current Ic is large, the switching circuit according to the third embodiment of the disclosure executes the bilateral control procedure in the same manner as in the first embodiment of the disclosure. In the switching circuit according to the third embodiment of the disclosure, the control method is different from that of the first embodiment of the disclosure in the case where the current Ic is small.

Figure 6:
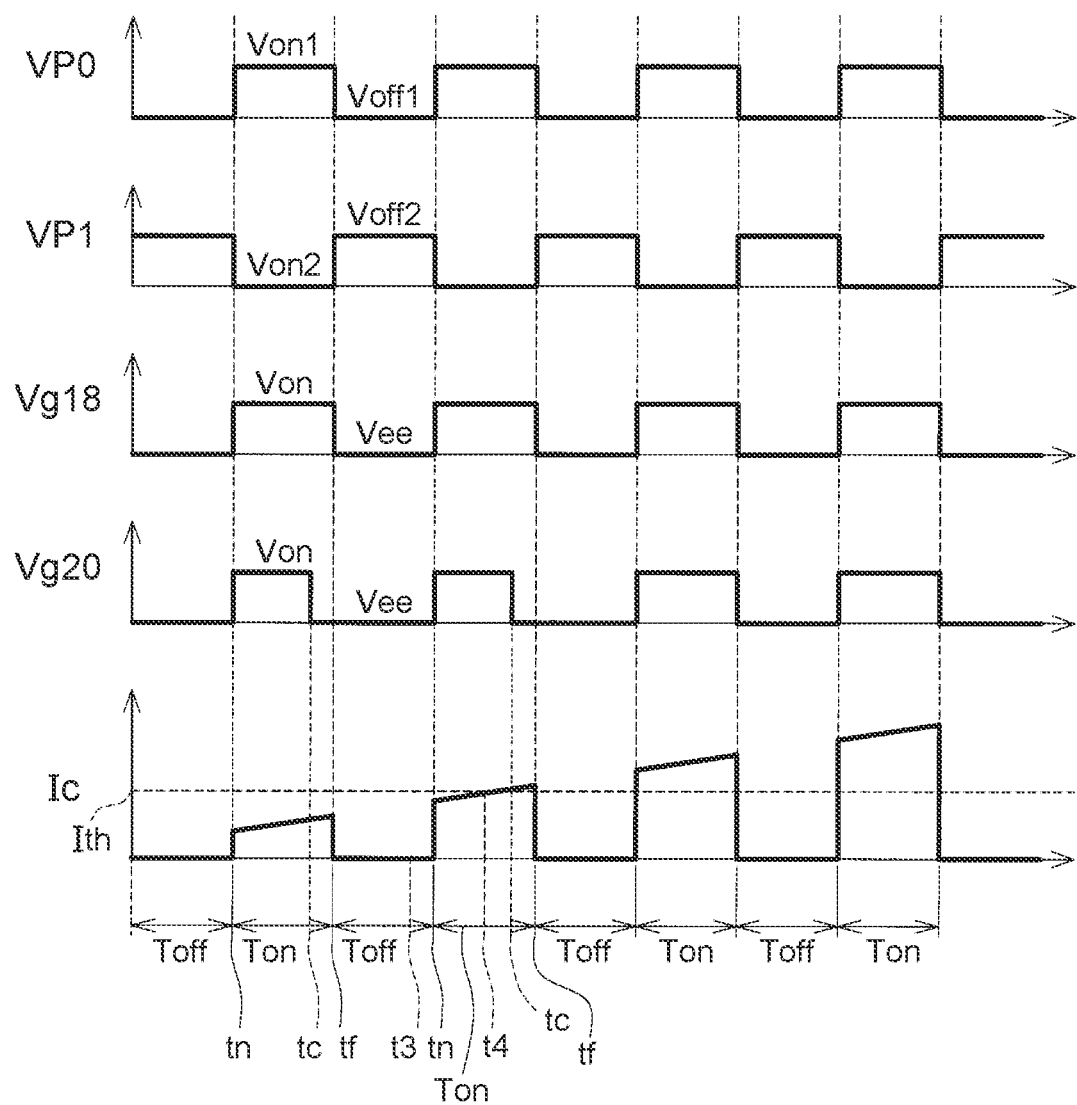
FIG. 6 is a graph showing changes in respective values with the passage of time in a unilateral control procedure and a bilateral control procedure in the third embodiment of the disclosure.

In the case where the current Ic is small, the switching circuit according to the third embodiment of the disclosure executes the unilateral control procedure shown in FIG. 6. Even in the case where the current Ic is small, the logic circuit 90 turns on both the IGBT 18 and the IGBT 20 at the turn-on timing tn. Then, the logic circuit 90 turns off the IGBT 20 at a timing tc immediately preceding the turn-off timing tf. After that, the logic circuit 90 holds the IGBT 20 off until the subsequent turn-on timing tn (i.e., until the lapse of the turn-off timing tf). Accordingly, the IGBT 18 turns off alone at the turn-off timing tf. For example, the logic circuit 90 determines at a timing t3 in FIG. 6 that the current Ic is smaller than the threshold Ith in the immediately preceding on period Ton. Then, the logic circuit 90 turns on both the IGBT 18 and the IGBT 20 at the subsequent turn-on timing tn. Then, the logic circuit 90 turns off the IGBT 20 at the timing tc before the turn-off timing tf. The IGBT 20 is held off until the lapse of the turn-off timing tf. At the timing tc, the IGBT 18 is held on without being turned off After that, the IGBT 18 is turned off at the turn-off timing tf. Accordingly, the IGBT 18 turns off alone at the turn-off timing tf. As described hitherto, according to the third embodiment of the disclosure, in the case where the current Ic is small, both the IGBT's 18 and 20 are turned on in part of the on period Ton, but the IGBT 20 is turned off prior to the IGBT 18.

Incidentally, a process of simultaneously turning on the IGBT's 18 and 20 at the turn-on timing tn in the unilateral control procedure of FIG. 6 is executed in the same manner as at the turn-on timing tn in the bilateral control procedure. A process of turning off the IGBT 18 alone at the turn-off timing tf in the unilateral control procedure of FIG. 6 is executed in the same manner as in the unilateral control procedure of the first embodiment of the disclosure. Besides, a process of turning off the IGBT 20 alone at the timing tc in the unilateral control procedure of FIG. 6 is executed by turning on the NMOS 72 with the NMOS's 71, 73 and 74 off.

In the aforementioned control, while the IGBT 20 turns off at the timing tc, the IGBT 18 is held on. Even when the IGBT 20 turns off, the IGBT 18 is on, so the voltage between the collector and emitter of the IGBT 20 is held equal to a low voltage. Accordingly, when the IGBT 20 turns off, no turn-off loss is caused. Besides, when the IGBT 18 turns off at the turn-off timing tf, the voltage between the collector and emitter of the IGBT 18 rises due to the turning off of the IGBT 18. Accordingly, the turn-off loss is caused at the turn-off timing tf. However, at the turn-off timing tf, the IGBT 18 turns off alone, so the turn-off loss is small. Accordingly, the switching circuit according to the third embodiment of the disclosure also makes it possible to reduce the turn-off loss. Besides, even in the case where the current Ic is small as described hitherto, the loads applied to the IGBT's 18 and 20 can be further reduced by scattering the current Ic to the IGBT's 18 and 20 in part of the on period Ton. Thus, the temperature of the semiconductor substrate 100 can be restrained from rising.

Incidentally, in the above-mentioned third embodiment of the disclosure, the logic circuit 90 makes a determination on the current Ic at a timing during the off period Toff (e.g., at the timing t3). However, in the third embodiment of the disclosure, the determination on the current Ic may be made at a timing during the on period Ton (e.g., at a timing t4 (i.e., at a timing before the timing tc for turning off the IGBT 20)). In this case, the determination can be made based on the current Ic at the timing t4.

Besides, in the above-mentioned third embodiment of the disclosure, a delay time from the timing tc when the IGBT 20 turns off to the turn-off timing tf when the IGBT 18 turns off is preferably equal to a time that is sufficient for the carriers in the region of the IGBT 20 of the semiconductor substrate 100 to disappear. On the other hand, the aforementioned delay time is preferably equal to or shorter than 10% of the on period Ton in order to minimize the influence on the control.

Besides, in the above-mentioned third embodiment of the disclosure, the IGBT 18 and the IGBT 20 are simultaneously turned on at the turn-on timing tn. However, the timing when the IGBT 20 turns on may be later than the turn-on timing tn.

A switching circuit according to the fourth embodiment of the disclosure has a configuration similar to that of the switching circuit according to the first embodiment of the disclosure shown in FIG. 2. In the case where the current Ic is large, the switching circuit according to the fourth embodiment of the disclosure executes the bilateral control procedure in the same manner as in the first embodiment of the disclosure. In the switching circuit according to the fourth embodiment of the disclosure, the control method is different from that of the first embodiment of the disclosure in the case where the current Ic is small.

Figure 7:
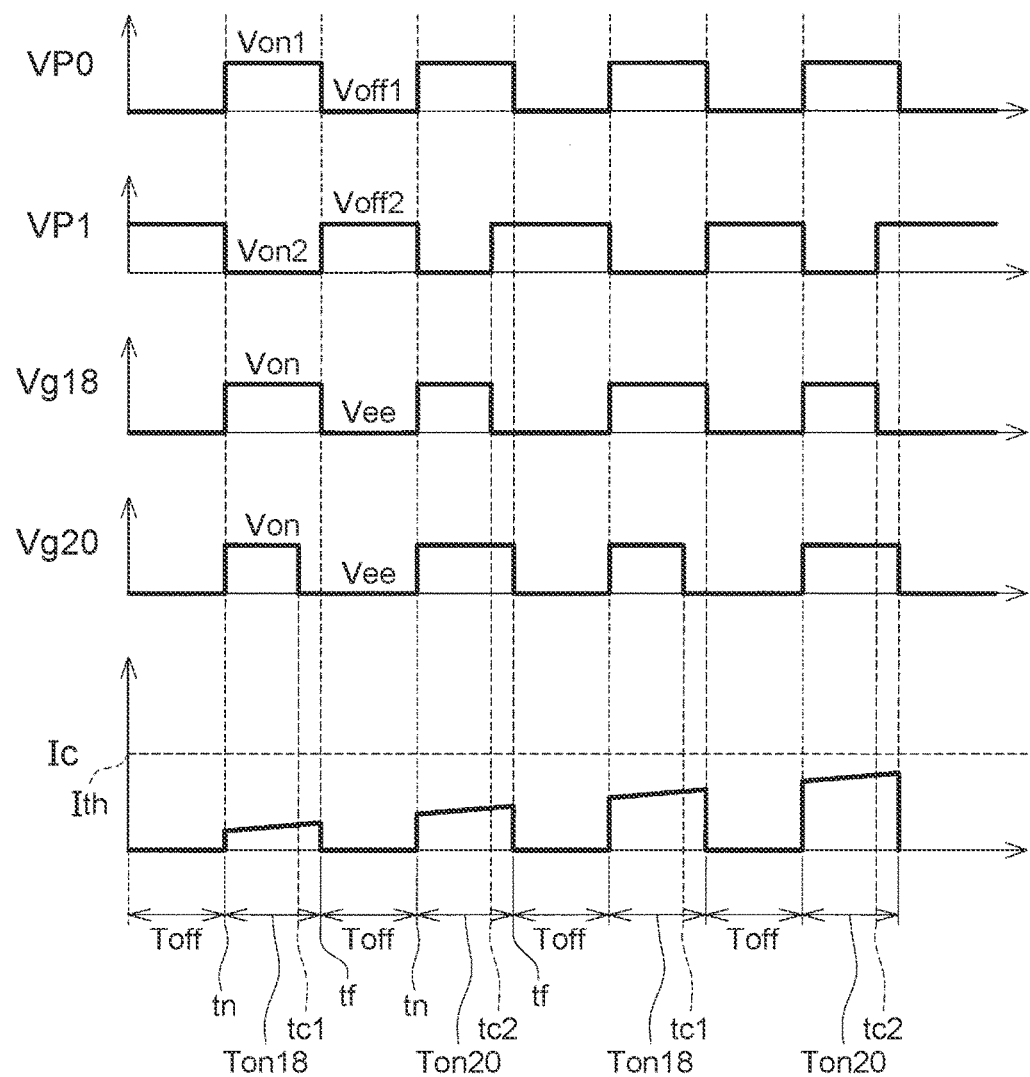
FIG. 7 is a graph showing changes in respective values with the passage of time in a unilateral control procedure in the fourth embodiment of the disclosure.

The control method of the fourth embodiment of the disclosure in the case where the current Ic is small is a method obtained by combining the control method of the second embodiment of the disclosure and the control method of the third embodiment of the disclosure with each other. In the fourth embodiment of the disclosure, a unilateral control procedure shown in FIG. 7 is executed in the case where the current Ic is small. In FIG. 7, the control is performed such that the on period Ton18, the off period Toff, the on period Ton20 and the off period Toff repeatedly emerge in this sequence. At the turn-on timing tn, both the IGBT 18 and the IGBT 20 turn on. The IGBT 18 and the IGBT 20 are on in the former half of the on period Ton18. The IGBT 20 turns off at a timing tc1 during the on period Ton18. The IGBT 18 turns off at the subsequent turn-off timing tf. In the off period Toff, the IGBT 18 and the IGBT 20 are off. Both the IGBT 18 and the IGBT 20 turn on at the subsequent turn-on timing tn. The IGBT 18 and the IGBT 20 are on in the former half of the on period Ton20. The IGBT 18 turns off at a timing tc2 during the on period Ton20. The IGBT 20 turns off at the subsequent turn-off timing tf. According to this configuration, the on period Ton18 when the energization time of the IGBT 18 is long and the on period Ton20 when the energization time of the IGBT 20 is long alternately emerge, so the heat generated in the semiconductor substrate 100 can be scattered.

In any one of the above-mentioned first to fourth embodiments of the disclosure, when the IGBT 18 and the IGBT 20 are simultaneously turned on, the gate-on wiring 58 and the gate-on wiring 59 are short-circuited by the PMOS's 53 and 54. Therefore, the IGBT 18 and the IGBT 20 can be substantially simultaneously turned on. Besides, in any one of the above-mentioned first to fourth embodiments of the disclosure, when the IGBT 18 and the IGBT 20 are simultaneously turned off, the gate-off wiring 78 and the gate-off wiring 79 are short-circuited by the NMOS's 73 and 74. Therefore, the IGBT 18 and the IGBT 20 can be substantially simultaneously turned off. Accordingly, the effect of scattering the load can be obtained. Besides, in any one of the above-mentioned first to fourth embodiments of the disclosure, when one of the IGBT 18 and the IGBT 20 is turned on, the PMOS's 53 and 54 turn off. Therefore, a leaking current can be prevented from flowing between the gate-on wiring 58 and the gate-on wiring 59. Besides, in any one of the above-mentioned third and fourth embodiments of the disclosure, when one of the IGBT 18 and the IGBT 20 is turned off from a state where both the IGBT 18 and the IGBT 20 are on, the PMOS's 53 and 54 turn off. Therefore, a leaking current is restrained from flowing between the gate-off wiring 78 and the gate-off wiring 79.

Figure 8:
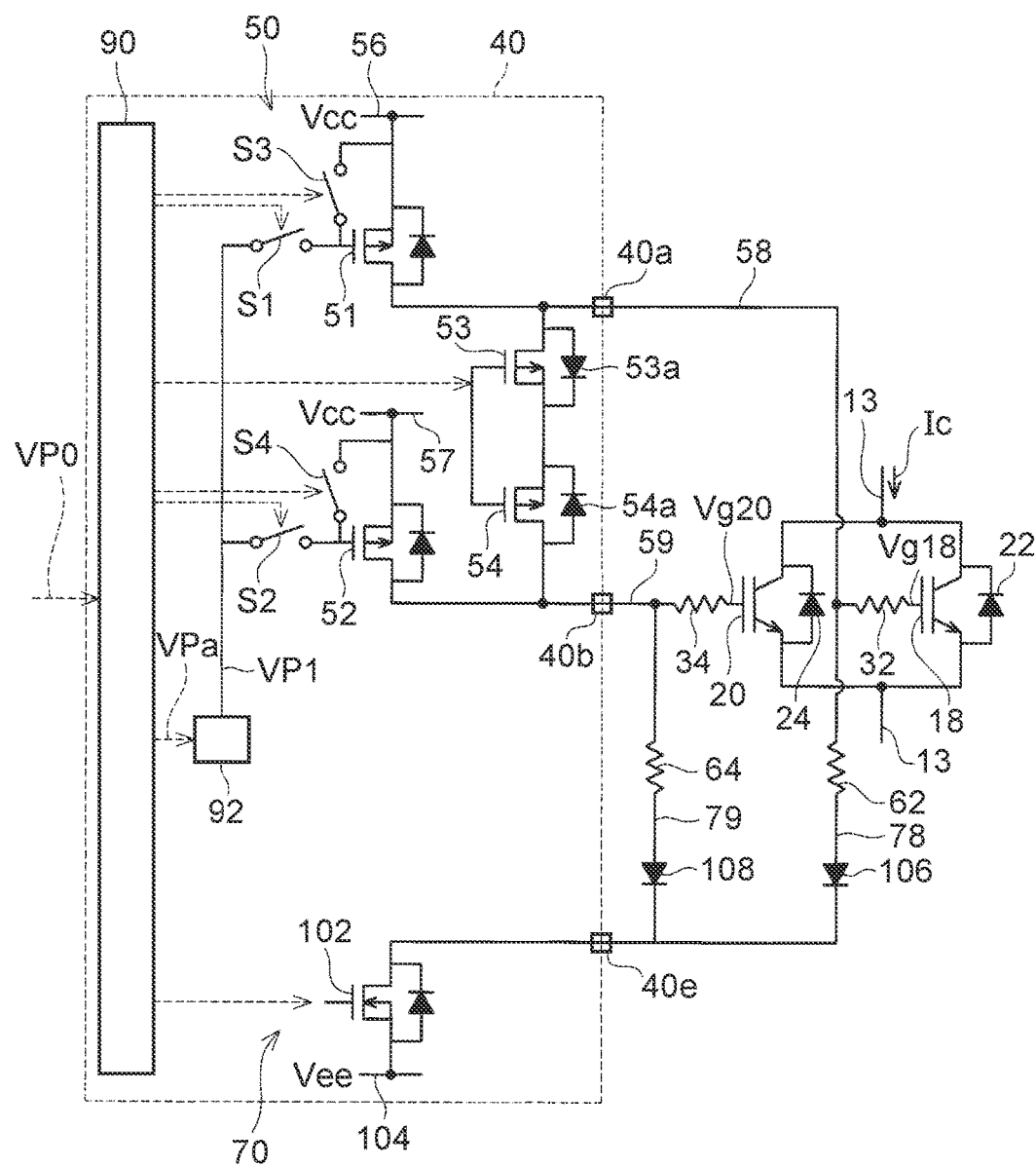
FIG. 8 is a circuit diagram of a switching circuit according to the fifth embodiment of the disclosure.

A switching circuit according to the fifth embodiment of the disclosure shown in FIG. 8 is different in the configuration of the gate-off circuit 70 from the switching circuit shown in FIG. 2. The other configurational details of the switching circuit according to the fifth embodiment of the disclosure are identical to those shown in FIG. 2.

In the fifth embodiment of the disclosure, the gate-off circuit 70 is constituted by a single NMOS 102. A source of the NMOS 102 is connected to a wiring 104 to which the reference potential Vee is applied. A drain of the NMOS 102 is connected to a terminal 40e. The terminal 40e is connected to the gate of the IGBT 18 via a diode 106, the gate resistor 62 and the gate resistor 32. A cathode of the diode 106 is connected to the terminal 40e, and an anode of the diode 106 is connected to the gate resistor 62. Besides, the terminal 40e is connected to the gate of the IGBT 20 via a diode 108, the gate resistor 64 and the gate resistor 34. A cathode of the diode 108 is connected to the terminal 40e, and an anode of the diode 108 is connected to the gate resistor 64. In the fifth embodiment of the disclosure, a wiring that connects the drain of the NMOS 71 and the gate of the IGBT 18 to each other is referred to as the gate-off wiring 78, and a wiring that connects the drain of the NMOS 71 and the gate of the IGBT 20 to each other is referred to as the gate-off wiring 79. A gate of the NMOS 102 is connected to the logic circuit 90. The signal VP2 obtained by inverting the PWM signal is input to the gate of the NMOS 102 from the logic circuit 90.

The switching circuit according to the fifth embodiment of the disclosure can perform the above-mentioned operations shown in FIGS. 4 and 5 (operations similar to those of the first and second embodiments of the disclosure). The switching circuit according to the fifth embodiment of the disclosure operates as follows. The NMOS 102 is held off in the on period Ton of the bilateral control procedure. Therefore, the gates of the IGBT's 18 and 20 are separated from the potential Vee. The gates of the IGBT's 18 and 20 are charged by the gate-on circuit 50 in the same manner as in the above-mentioned first to fourth embodiments of the disclosure. Accordingly, both the IGBT's 18 and 20 turn on. In the off period Toff of the bilateral control procedure, the NMOS 102 is turned on, and the PMOS's 51 and 52 are turned off. Accordingly, the gates of the IGBT's 18 and 20 are connected to the potential Vee, and the gates of the IGBT's 18 and 20 are discharged. Accordingly, both the IGBT's 18 and 20 turn off. In the unilateral control procedure, the PMOS's 53 and 54 are held off. Besides, in the on period Ton of the unilateral control procedure, the NMOS 102 is held off. Besides, in the on period Ton of the unilateral control procedure, one of the PMOS's 51 and 52 is turned on, and the other is turned off. For example, in the case where the IGBT 18 is turned on, the PMOS 51 is turned on, and the PMOS 52 is turned off. In this case, the gate of the IGBT 18 is separated from the potential Vee due to the turning off of the NMOS 102, and is charged due to the turning on of the PMOS 51. That is, the IGBT 18 turns on. Besides, in this case, the gate of the IGBT 20 is separated from the potential Vee due to the turning off of the NMOS 102, but is also separated from the potential Vcc due to the turning off of the PMOS's 52, 53 and 54. Accordingly, the gate of the IGBT 20 is held at the potential Vee in the immediately preceding off period. Therefore, the IGBT 20 is held off in the on period Ton. In the off period Toff of the unilateral control procedure, the NMOS 102 is turned on, and the PMOS's 51 and 52 are turned off. Accordingly, the gates of the IGBT's 18 and 20 are connected to the potential Vee, and both the IGBT's 18 and 20 turn off. As described hitherto, the switching circuit according to the fifth embodiment of the disclosure also makes it possible to switch both the IGBT's 18 and 20 in the bilateral control procedure, and switch one of the IGBT's 18 and 20 in the unilateral control procedure.

Besides, the switching circuit according to the fifth embodiment of the disclosure also makes it possible to restrain the loads applied to the IGBT's 18 and 20 from being biased at the on timing, by short-circuiting the gate-on wiring 58 and the gate-on wiring 59 with the aid of the PMOS's 53 and 54. Besides, in the switching circuit according to the fifth embodiment of the disclosure, the IGBT's 18 and 20 are turned off by the single NMOS 102, so the timings for turning off the IGBT's 18 and 20 can be restrained from deviating from each other. That is, the loads applied to the IGBT's 18 and 20 at the off timing can be restrained from being biased. Accordingly, the switching circuit according to the fifth embodiment of the disclosure also makes it possible to obtain the effect of scattering the load.

Figure 9:
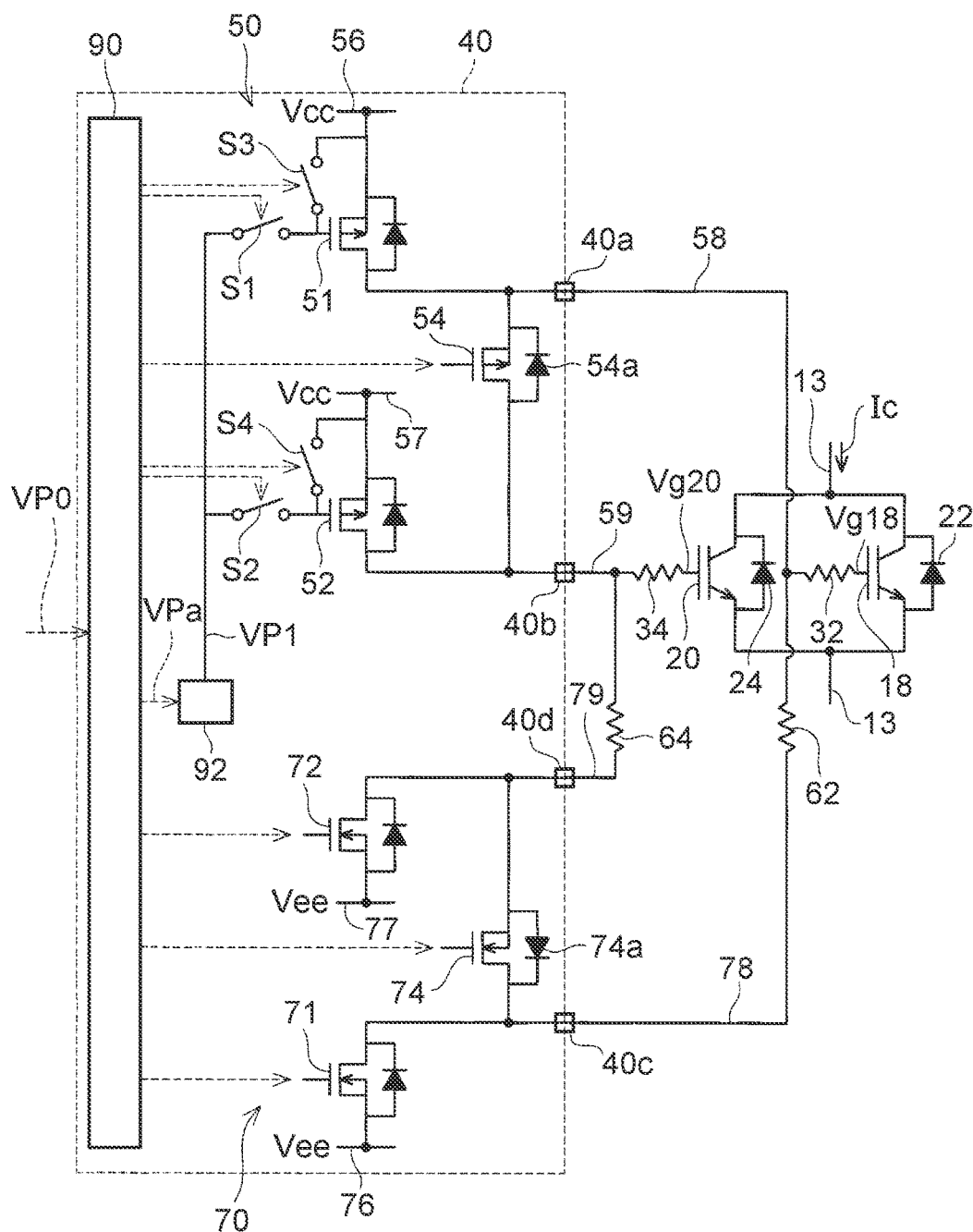
FIG. 9 is a circuit diagram of a switching circuit according to the sixth embodiment of the disclosure.

In a switching circuit according to the sixth embodiment of the disclosure shown in FIG. 9, the gate-on wiring 58 and the gate-on wiring 59 are connected to each other by the single PMOS 54. Besides, in the switching circuit according to the sixth embodiment of the disclosure, the gate-off wiring 78 and the gate-off wiring 79 are connected to each other by the single NMOS 74. The other configurational details of the switching circuit according to the sixth embodiment of the disclosure are identical to those shown in FIG. 2.

The switching circuit according to the sixth embodiment of the disclosure can perform the control shown in FIGS. 4 and 6. As is apparent from FIGS. 4 and 6, the gate potential Vg18 does not become lower than the gate potential Vg20 in the unilateral control procedure of FIGS. 4 and 6. That is, the potential of the gate-on wiring 58 does not become lower than the potential of the gate-on wiring 59. Accordingly, as shown in FIG. 9, the leakage of a current between the gate-on wiring 58 and the gate-on wiring 59 can be suppressed by the single PMOS 54 that is equipped with the parasitic diode 54a that prevents a current from running from the gate-on wiring 58 toward the gate-on wiring 59.

Besides, the gate potential Vg18 does not become lower than the gate potential Vg20 as described above, so the potential of the gate-off wiring 78 does not become lower than the potential of the gate-off wiring 79. Accordingly, as shown in FIG. 9, the leakage of a current between the gate-off wiring 78 and the gate-off wiring 79 can be suppressed by the single NMOS 74 that is equipped with the parasitic diode 74a that prevents a current from running from the gate-off wiring 78 toward the gate-off wiring 79.

As described above, the circuit configuration can be simplified in the case where the IGBT to which a high load is applied in the unilateral control procedure is not replaced.

Figure 10:
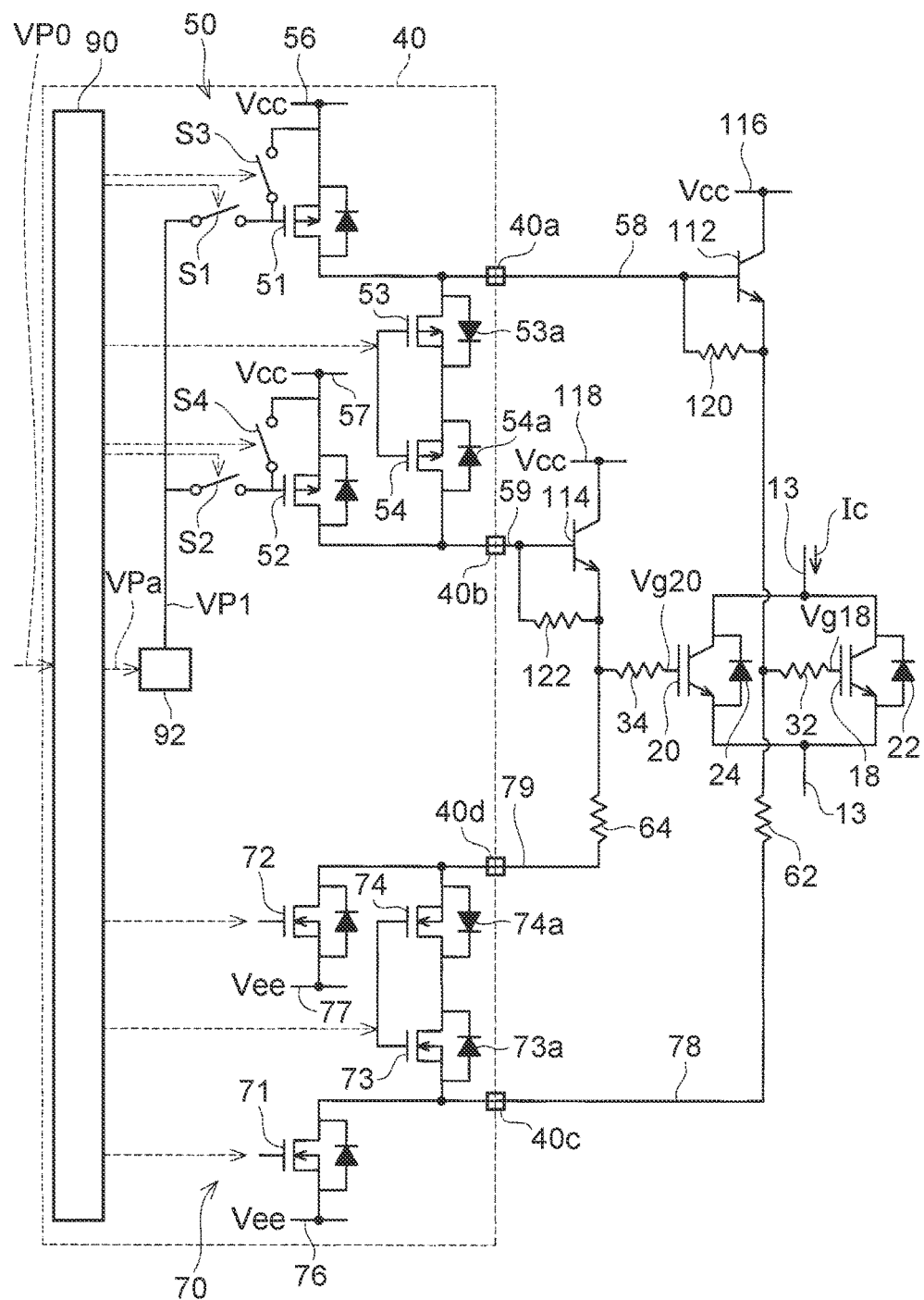
FIG. 10 is a circuit diagram of a switching circuit according to the seventh embodiment of the disclosure.

A switching circuit according to the seventh embodiment of the disclosure shown in FIG. 10 has npn-type bipolar transistors 112 and 114. The other configurational details of the switching circuit according to the seventh embodiment of the disclosure are identical to those shown in FIG. 2.

In the switching circuit according to the seventh embodiment of the disclosure, the drain of the PMOS 51 is connected to the gate of the IGBT 18 via the bipolar transistor 112. More specifically, the drain of the PMOS 51 is connected to a base of the bipolar transistor 112. A collector of the bipolar transistor 112 is connected to a wiring 116 to which the potential Vcc is applied. An emitter of the bipolar transistor 112 is connected to the gate of the IGBT 18 via the gate resistor 32. The base and emitter of the bipolar transistor 112 are connected to each other by a resistor 120. Incidentally, the bipolar transistor 112 is a discrete component that is installed outside the gate control IC 40.

In the switching circuit according to the seventh embodiment of the disclosure, the drain of the PMOS 52 is connected to the gate of the IGBT 20 via the bipolar transistor 114. More specifically, the drain of the PMOS 52 is connected to a base of the bipolar transistor 114. A collector of the bipolar transistor 114 is connected to a wiring 118 to which the potential Vcc is applied. An emitter of the bipolar transistor 114 is connected to the gate of the IGBT 20 via the gate resistor 34. The base and emitter of the bipolar transistor 114 are connected to each other by a resistor 122. Incidentally, the bipolar transistor 114 is a discrete component that is arranged outside the gate control IC 40.

In the switching circuit according to the seventh embodiment of the disclosure, when the PMOS 51 turns on, the base potential of the bipolar transistor 112 rises, and the bipolar transistor 112 turns on. As a result, a gate current flows from the wiring 116 to the gate of the IGBT 18 via the bipolar transistor 112 and the gate resistor 32. Thus, the IGBT 18 turns on.

Besides, in the switching circuit according to the seventh embodiment of the disclosure, when the PMOS 52 turns on, the base potential of the bipolar transistor 114 rises, and the bipolar transistor 114 turns on. As a result, a gate current flows from the wiring 118 to the gate of the IGBT 20 via the bipolar transistor 114 and the gate resistor 34. Thus, the IGBT 20 turns on.

As described above, in the seventh embodiment of the disclosure, the PMOS's 51 and 52 turn on, and the bipolar transistors 112 and 114 hence turn on. Thus, the IGBT's 18 and 20 turn on. The bipolar transistors 112 and 114 are discrete components, so a large current can be caused to flow therethrough. Accordingly, even in the case where the gate capacities of the IGBT's 18 and 20 are large, the gates of the IGBT's 18 and 20 can be charged at high speed. That is, the gates of the IGBT's 18 and 20 with large gate capacities can be charged at high speed, through the use of the PMOS's 51 and 52 with small current capacities, which are formed in the gate control IC 40. That is, the gates of the IGBT's can be charged either directly by the gate control IC 40 as a general-purpose product, or indirectly via the bipolar transistors. According to this circuit configuration, the general-purpose properties of the gate control IC 40 are further enhanced. Besides, for the same reason as in the above-mentioned first embodiment of the disclosure, when the PMOS 51 and the PMOS 52 are turned on in the bilateral control procedure, there arises hardly any difference between the drain potential of the PMOS 51 and the drain potential of the PMOS 52. That is, there arises hardly any difference between the base potential of the bipolar transistor 112 and the base potential of the bipolar transistor 114. Furthermore, there arises hardly any dispersion in the voltage between the base and the emitter when the bipolar transistors are energized. That is, in the on-period of the bilateral control procedure, the voltage between the base and emitter of the bipolar transistor 112 is approximately equal to the voltage between the base and emitter of the bipolar transistor 114. Accordingly, when the PMOS 51 and the PMOS 52 are turned on in the bilateral control procedure, there arises hardly any difference between the gate potential of the IGBT 18 and the gate potential of the IGBT 20. Accordingly, the switching circuit according to the seventh embodiment of the disclosure also makes it possible to substantially simultaneously turn on the IGBT 18 and the IGBT 20. Therefore, the switching circuit according to the seventh embodiment of the disclosure also makes it possible to obtain the effect of scattering the load.

Besides, the switching circuit according to each of the above-mentioned first to seventh embodiments of the disclosure makes a changeover between the second control procedure and the first control procedure, depending on whether or not the current Ic in the immediately preceding on period Ton is larger than the threshold Ith. However, the switching circuit may calculate a predicted value of the current Ic in the subsequent on period Ton based on the current Ic in the immediately preceding on period Ton, and make a changeover between the second control procedure and the first control procedure based on the predicted value.

Besides, in each of the above-mentioned first to seventh embodiments of the disclosure, the PMOS's 51 to 54 and the NMOS's 71 to 74 are formed in the gate control IC 40. However, one, some or all of these PMOS's and NMOS's may be a component or components installed outside the gate control IC 40. In this case, a large current can be caused to flow through the component or components installed outside.

Besides, in each of the above-mentioned first to seventh embodiments of the disclosure, the single control amplifier 92 applies the signal VP1 to the PMOS 51 and the PMOS 52. However, a control amplifier for the PMOS 51 and a control amplifier for the PMOS 52 may be provided independently of each other. In this case, when the PMOS's 51 and 52 are turned on, there may arise a deviation between the signal VP1 for the PMOS 51 and the signal VP1 for the PMOS 52, and the timing when the PMOS 51 turns on and the timing when the PMOS 52 turns on may deviate from each other. However, in this case as well, the timing when the IGBT 18 turns on and the timing when the IGBT 20 turns on can be restrained from deviating from each other due to the turning on of the PMOS's 53 and 54.

Figure 11:
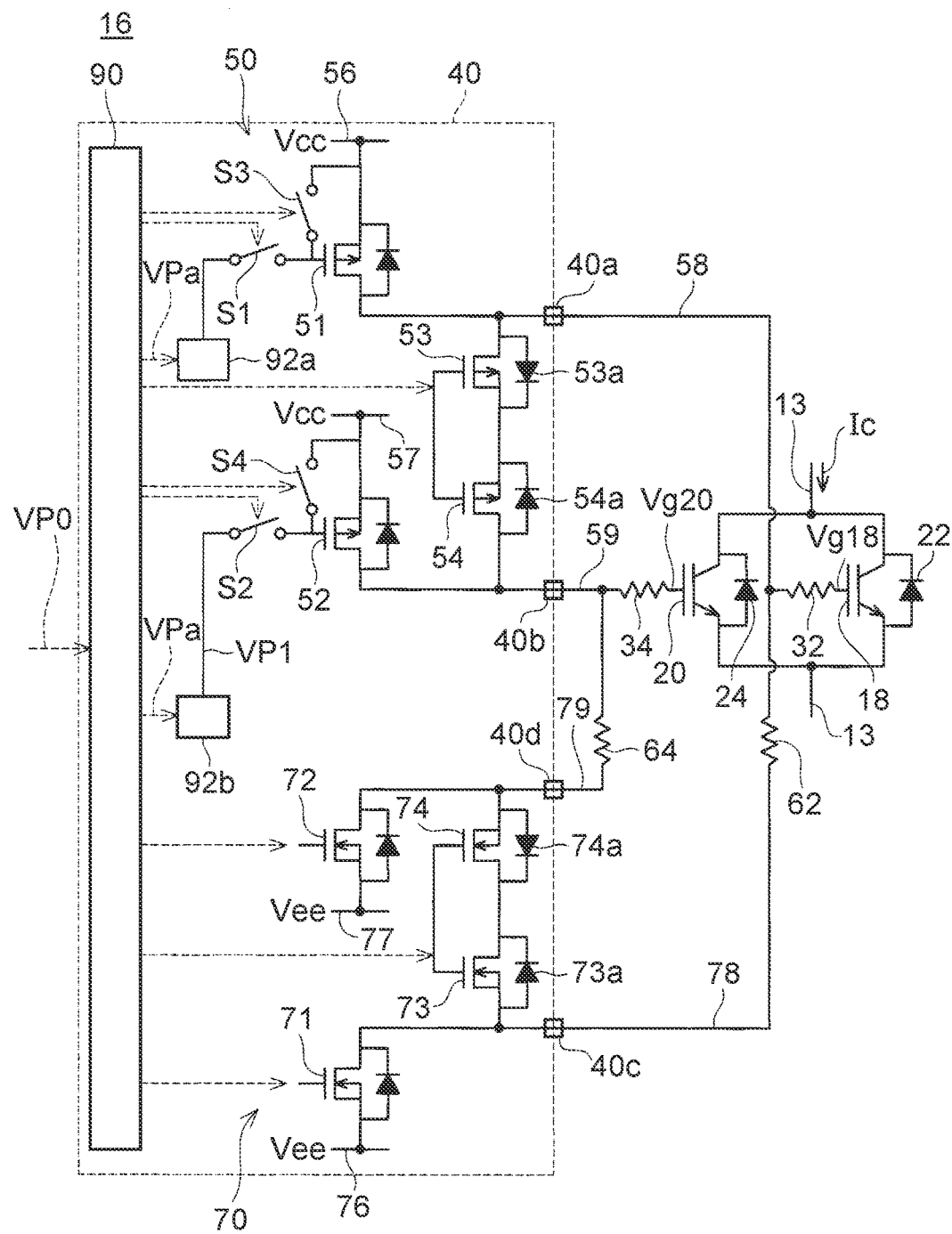
FIG. 11 is a circuit diagram of a switching circuit according to the eighth embodiment of the disclosure.

Besides, in each of the above-mentioned first to seventh embodiments of the disclosure, the single control amplifier 92 controls the two PMOS's 51 and 52. However, as shown in FIG. 11, a control amplifier 92a for controlling the PMOS 51 and a control amplifier 92b for controlling the PMOS 52 may be provided separately from each other.

Besides, in each of the above-mentioned first to seventh embodiments of the disclosure, the control amplifier 92 measures both the gate potential and gate current of each of the IGBT's. However, the control amplifier 92 may measure only one of the gate potential and the gate current.

A relationship between the component elements in the respective embodiments of the disclosure and the component elements in the claims will be described hereinafter. The gate-on circuit 50 in FIGS. 2 and 8 to 10 is an example of the control circuit in the claims. In this case, the PMOS 51 is an example of the first switching element in the claims, the PMOS 52 is an example of the second switching element in the claims, the potential Vcc is an example of the reference potential in the claims, and each of the PMOS's 53 and 54 is an example of the third switching element in the claims. Besides, in this case, the drain of the PMOS 51 is an example of the first main electrode in the claims, the source of the PMOS 51 is an example of the second main electrode in the claims, the drain of the PMOS 52 is an example of the third main electrode in the claims, and the source of the PMOS 52 is an example of the fourth main electrode in the claims. Furthermore, in this case, the turn-on timing tn in the bilateral control procedure is an example of "when the gate current is caused to simultaneously flow through the first IGBT and the second IGBT" in the claims, and the turn-on timing tn in the unilateral control procedure is an example of "when the gate current is caused to flow through the first target IGBT and no gate current is caused to flow through the second target IGBT" in the claims. Besides, the gate-off circuit 70 in FIGS. 2, 9 and 10 is also an example of the control circuit in the claims. In this case, the NMOS 71 is an example of the first switching element in the claims, the NMOS 72 is an example of the second switching element in the claims, the potential Vee is an example of the reference potential in the claims, and each of the NMOS's 73 and 74 is an example of the third switching element in the claims. Besides, in this case, the source of the NMOS 71 is an example of the first main electrode in the claims, the drain of the NMOS 71 is an example of the second main electrode in the claims, the source of the NMOS 72 is an example of the third main electrode in the claims, and the drain of the NMOS 72 is an example of the fourth main electrode in the claims. Furthermore, in this case, the turn-off timing tf in the bilateral control procedure is an example of "when the gate current is caused to simultaneously flow through the first IGBT and the second IGBT" in the claims, and the turn-off timing tf in the unilateral control procedure is an example of "when the gate current is caused to flow through the first target IGBT and no gate current is caused to flow through the second target IGBT" in the claims. Each of the signals VP0, VP1 and VP2 in the embodiments of the disclosure is an example of the signal indicating the turn-on timing and the turn-off timing in the claims. The bilateral control procedure in the embodiments of the disclosure is an example of the first control procedure in the claims. The unilateral control procedure in the embodiments of the disclosure is an example of the second control procedure in the claims. The unilateral control procedure in FIGS. 4 and 6 is an example of the configuration in which the second IGBT is constantly the second target IGBT. The unilateral control procedure in FIGS. 5 and 7 is an example of the configuration in which the first IGBT and the second IGBT alternately become the second target IGBT. Besides, the bipolar transistor 112 in FIG. 10 is an example of the first bipolar transistor in the claims, and the bipolar transistor 114 is an example of the second bipolar transistor in the claims. In this case, the collector of the bipolar transistor 112 is an example of the fifth main electrode in the claims, the emitter of the bipolar transistor 112 is an example of the sixth main electrode in the claims, the collector of the bipolar transistor 114 is an example of the seventh main electrode in the claims, and the emitter of the bipolar transistor 114 is an example of the eighth main electrode in the claims.

The technical elements disclosed by the present specification will be mentioned hereinafter. Incidentally, the respective technical elements mentioned below are useful independently of one another.

In one of the exemplary configurations disclosed by the present specification, the control circuit is a circuit that charges the gate of the first IGBT and the gate of the second IGBT. The control circuit controls the gate potential of the first IGBT while performing detection thereof in charging the gate of the first IGBT, and controls the gate potential of the second IGBT while performing detection thereof in charging the gate of the second IGBT.

In this configuration, when the first IGBT and the second IGBT are turned on, the potentials of the gates of the respective IGBT's are controlled while being detected. In such a configuration, there may arise a difference between the gate potential of the first IGBT and the gate potential of the second IGBT when the first IGBT and the second IGBT are on, due to the difference between the properties of the first switching element and the properties of the second switching element. When the difference thus arises between the potentials of the gates, the current flowing through the first IGBT and the current flowing through the second IGBT are unbalanced, and the load applied to one of the IGBT's becomes high. In contrast, the difference between the gate potential of the first IGBT and the gate potential of the second IGBT can be reduced by connecting the second main electrode of the first switching element and the fourth main electrode of the second switching element to each other by the third switching element. Thus, the current flowing through the first IGBT and the current flowing through the second IGBT can be restrained from being unbalanced.

In one of the exemplary configurations disclosed by the present specification, the switching circuit further has the first bipolar transistor and the second bipolar transistor. The first bipolar transistor is equipped with the base that is connected to the second main electrode, the fifth main electrode that is connected to the reference potential, and the sixth main electrode that is connected to the gate of the first IGBT. The second bipolar transistor is equipped with the base that is connected to the fourth main electrode, the seventh main electrode that is connected to the reference potential, and the eighth main electrode that is connected to the gate of the second IGBT. The first switching element, the second switching element and the third switching element are incorporated in the IC. The first bipolar transistor and the second bipolar transistor are installed outside the IC.

In this configuration, the second main electrode is connected to the gate of the first IGBT via the first bipolar transistor. Besides, the fourth main electrode is connected to the gate of the second IGBT via the second bipolar transistor. There arises hardly any dispersion in the voltage drop that is produced between the bases of the bipolar transistors and the main electrodes. Besides, in the case where the gate of the first IGBT and the gate of the second IGBT are simultaneously charged, the third switching element turns on, so there arises hardly any difference between the potential of the second main electrode and the potential of the fourth main electrode. Accordingly, in the case where the gate of the first IGBT and the gate of the second IGBT are simultaneously charged, a difference between the gate potential of the first IGBT and the gate potential of the second IGBT is unlikely to arise. Therefore, according to this configuration, the timing for switching the first IGBT and the timing for switching the second IGBT can be prevented from deviating from each other. Besides, the first switching element, the second switching element and the third switching element are preferably incorporated in the IC so as to be imparted with general-purpose properties. However, when these switching elements are incorporated in the IC, the sizes of these elements become small, and a large current cannot be caused to flow therethrough. Therefore, when the capacities of the gates of the IGBT's are large, it is difficult to directly charge the gates of the IGBT's from the IC. In contrast, as described above, when the switching elements that are incorporated in the IC are connected to the gates of the IGBT's via the bipolar transistors, the first IGBT and the second IGBT can be favorably controlled.

In one of the exemplary configurations disclosed by the present specification, the first IGBT and the second IGBT alternately become the second target IGBT. The third switching element is structured such that the switching element having the parasitic diode that prevents a current from running from the second main electrode toward the fourth main electrode and the switching element having the parasitic diode that prevents a current from running from the fourth main electrode toward the second main electrode are connected in series to each other.

According to this structure, both in the case where the first IGBT is turned on and the second IGBT is turned off and in the case where the first IGBT is turned off and the second IGBT is turned on, a leaking current can be prevented from flowing through the parasitic diode of the third switching element.

In one of the exemplary configurations disclosed by the present specification, the second IGBT is the second target IGBT. The third switching element is the switching element having the parasitic diode that prevents a current from running from the second main electrode toward the fourth main electrode.

In this configuration, the second IGBT is constantly the second target IGBT. Therefore, there is no state where the second IGBT is on and the first IGBT is off. That is, in a normal usage state, the potential of the fourth main electrode of the second switching element does not become higher than the potential of the second main electrode of the first switching element. Accordingly, even when the third switching element does not have a parasitic diode that prevents a current from running from the fourth main electrode toward the second main electrode, there is no problem. Besides, according to this configuration, the third switching element can be simplified.

Although the embodiments of the disclosure have been described above in detail, these are nothing more than exemplifications and do not limit the claims. The art set forth in the claims encompasses various modifications and alterations of the concrete examples exemplified above. The technical elements described in the present specification or the drawings exert technical usefulness alone or in various combinations, and should not be limited to the combinations set forth in the claims at the time of the filing of the application. Besides, the art exemplified in the present specification or the drawings simultaneously achieves a plurality of objects, and is technically useful by achieving one of the objects alone.

What is claimed is:

1. A switching circuit comprising:
   a first IGBT;
   a second IGBT;
   a wiring in which a parallel circuit of the first IGBT and the second IGBT is inserted; and
   a control circuit configured to switch the first IGBT and the second IGBT by controlling gate currents of the first IGBT and the second IGBT, wherein
   the control circuit includes
   a first switching element including a first main electrode and a second main electrode, the first switching element controlling a current between the first main electrode and the second main electrode, the first main electrode connected to a reference potential, and the first switching element configured to control the gate current of the first IGBT in accordance with a potential of the second main electrode, a second switching element including a third main electrode and a fourth main electrode, the second switching element controlling a current between the third main electrode and the fourth main electrode, the third main electrode connected to the reference potential, and the second switching element configured to control the gate current of the second IGBT in accordance with a potential of the fourth main electrode, and a third switching element connected between the second main electrode and the fourth main electrode, and the control circuit is configured to turn on both the first IGBT and the second IGBT at a turn-on timing, and turn off both the first IGBT and the second IGBT at a turn-off timing, when a current flowing through the wiring is larger than a threshold, turn on a first target IGBT as one of the first IGBT and the second IGBT at the turn-on timing, turn off the first target IGBT at the turn-off timing, and turn off a second target IGBT as the other of the first IGBT and the second IGBT prior to the turn-off timing, when the current flowing through the wiring is smaller than the threshold, turn on the first switching element and the second switching element with the third switching element on, when the gate currents are caused to simultaneously flow through the first IGBT and the second IGBT, and turn on that one of the first switching element and the second switching element which controls the first target IGBT with the third switching element off, when the gate current is caused to flow through the first target IGBT and the gate current is not caused to flow through the second target IGBT.

2. The switching circuit according to claim 1, wherein the control circuit is configured to charge gates of the first IGBT and the second IGBT, charge the gate of the first IGBT while detecting a gate potential of the first IGBT, and charge the gate of the second IGBT while detecting a gate potential of the second IGBT.

3. The switching circuit according to claim 1, further comprising:

a first bipolar transistor including a base connected to the second main electrode, a fifth main electrode connected to the reference potential, and a sixth main electrode connected to the gate of the first IGBT; and a second bipolar transistor including a base connected to the fourth main electrode, a seventh main electrode connected to the reference potential, and an eighth main electrode connected to the gate of the second IGBT, wherein the first switching element, the second switching element and the third switching element are incorporated in the control circuit, and the first bipolar transistor and the second bipolar transistor are installed outside the control circuit.

4. The switching circuit according to claim 1, wherein the control circuit is configured to perform control such that the first IGBT and the second IGBT alternately become the second target IGBT, and the third switching element includes a fourth switching element including a first parasitic diode that prevents a current from running from the second main electrode toward the fourth main electrode, and a fifth switching element including a second parasitic diode that prevents a current from running from the fourth main electrode toward the second main electrode, the fourth switching element and the fifth switching element connected in series to each other.

5. The switching circuit according to claim 1, wherein the control circuit is configured to perform control such that the second IGBT becomes the second target IGBT, and the third switching element is a fourth switching element including a first parasitic diode that prevents the current from running from the second main electrode toward the fourth main electrode.

6. A switching circuit comprising:

a first IGBT;

a second IGBT;

a wiring in which a parallel circuit of the first IGBT and the second IGBT is inserted; and a control circuit including a first gate voltage control circuit that connects to a gate electrode of the first IGBT and that is configured to control a gate voltage of the first IGBT, a second gate voltage control circuit that connects to a gate electrode of the second IGBT and that is configured to control a gate voltage of the second IGBT, and a short-circuit control circuit that is configured to connect or disconnect between the gate electrode of the first IGBT and the gate electrode of the second IGBT, wherein the control circuit is configured to turn on both the first IGBT and the second IGBT at a turn-on timing, and turn off both the first IGBT and the second IGBT at a turn-off timing, when a current flowing through the wiring is larger than a threshold, and turn on the first IGBT without turning on the second IGBT at the turn-on timing, and turn off the first IGBT at the turn-off timing, when the current flowing through the wiring is smaller than the threshold, the short-circuit control circuit ensures connection between the first gate voltage control circuit and the second gate voltage control circuit when both the first IGBT and the second IGBT are turned on, and the short-circuit control circuit ensures disconnection between the first gate voltage control circuit and the second gate voltage control circuit when the first IGBT is turned on without turning on the second IGBT.

* * * * *